United States Patent [19]
Azuma et al.

[11] Patent Number: 5,516,363
[45] Date of Patent: May 14, 1996

[54] SPECIALLY DOPED PRECURSOR SOLUTIONS FOR USE IN METHODS OF PRODUCING DOPED ABO₃-TYPE AVERAGE PEROVSKITE THIN-FILM CAPACITORS

[75] Inventors: Masamichi Azuma, Colorado Springs, Colo.; Bradley M. Melnick, Mesa, Ariz.; Michael C. Scott; Carlos A. Paz de Araujo, both of Colorado Springs, Colo.

[73] Assignees: Symetrix Corporation, Colorado Springs, Colo.; Matsushita Electronics Corporation, Osaka, Japan

[21] Appl. No.: 302,585

[22] Filed: Sep. 8, 1994

Related U.S. Application Data

[63] Continuation-in-part of Ser. No. 165,082, Dec. 10, 1993, which is a continuation-in-part of Ser. No. 132,744, Oct. 6, 1993, which is a continuation-in-part of Ser. No. 993,380, Dec. 18, 1992, Pat. No. 5,456,945, Ser. No. 981,133, Nov. 24, 1992, Pat. No. 5,423,285, and Ser. No. 965,190, Oct. 23, 1992, abandoned, which is a continuation-in-part of Ser. No. 807,439, Dec. 13, 1991, abandoned.

[51] Int. Cl.⁶ ........................................................ C09D 4/00
[52] U.S. Cl. ................................ 106/287.18; 106/287.19
[58] Field of Search ........................... 106/287.18, 287.19

[56] References Cited

U.S. PATENT DOCUMENTS

| | | | |
|---|---|---|---|
| 4,946,710 | 8/1990 | Miller et al. | 427/126.3 |
| 5,034,550 | 7/1991 | Sherif | 556/54 |
| 5,046,043 | 9/1991 | Miller et al. | 365/145 |
| 5,217,754 | 8/1993 | Santiago-Aviles et al. | 427/226 |

FOREIGN PATENT DOCUMENTS

| | | |
|---|---|---|
| 0125507A2 | 11/1984 | European Pat. Off. . |
| 0489519A2 | 6/1992 | European Pat. Off. ................ 21/314 |

OTHER PUBLICATIONS

Melnick, B. M., et al; Process Optimization and Characterization of Device Worthy Sol–Gel Based PZT for Ferroelectric Memories, Ferroelectrics (1990), vol. 109, pp. 1–23.

Vest, G. M., et al; Synthesis of Metallo–Organic Compounds for Mod Powders and Films, Mat. Res. Soc. Symp. Proc., (1986), vol. 60, pp. 35–42.

Mantese, J. V., et al; Metalorganic Deposition (Mod): A Nonvacuum, Spin–On, Liquid–Based, Thin Film Method. MRS Bulletin (Oct. 1989), pp. 48–53.

Vest, R. W., et al; PBTIO3 Films From Metalloorganic Precursors. IEEE Transactions on Ultrasonics, Ferroelectrics, and Frequency Control (Nov. 1988), vol. 35, No. 6, pp. 711–717.

Azuma, M., et al; Electrical Characteristics of High Dielectric Constant Materials for Integrated Ferroelectrics. Presentation, 1992 ISIF Conference, (Mar. 9–11, 1992), pp. 109–117.

Mihara, T., et al; Feasibility for Memory Devices and Electrical Characterization of Newly Developed Fatigue Free Capacitors; Presentation, 1992 ISIF Conference, (Mar. 9–11, 1992), pp. 137–157.

Lines, M. E., et al; Principles and Applications of Ferroelectrics and Related Materials; (1977), Clarendon Press (Oxford), pp. 241–292, 620–633.

McMillan, L. D., et al; Deposition of Ba1–XSRXTIO3 and SRTIO3 via Liquid Source CVD (LSCVD) for ULSI DRAMs. Presentation, 1992 ISIF Conference, (Mar. 9–11, 1992), private paper.

Primary Examiner—David Brunsman
Attorney, Agent, or Firm—Duft, Graziano & Forest

[57] ABSTRACT

Metal doping agents are introduced into metal polyoxyalkylated liquid precursor solutions for use in processes for forming thin-layer capacitors (10) to be used in integrated circuits such as DRAMS and the like. The dopants serve to reduce capacitor leakage current by altering a dominant type of electron emission, as determined by a change in the slope of a line plotted as leakage current versus bias voltage. The specially doped precursor solutions preferably include mixtures of Ce, Cr, Dy, Mn, and Ti moieties.

24 Claims, 8 Drawing Sheets

SPECIALLY DOPED PRECURSOR SOLUTIONS FOR USE IN METHODS OF PRODUCING DOPED ABO$_3$-TYPE AVERAGE PEROVSKITE THIN-FILM CAPACITORS

RELATED APPLICATIONS

This application is a continuation-in-part of U.S. patent application Ser. No. 08/165,082, filed Dec. 10, 1993, which in turn is a continuation-in-part of application Ser. No. 08/132,744, filed Oct. 6, 1993, which in turn is a continuation-in-part of U.S. patent applications Ser. No. 07/993,380, filed Dec. 18, 1992, now U.S. Pat. No. 5,456,945, Ser. No. 07/981,133, filed Nov. 24, 1992, now U.S. Pat. No. 5,423,285, and Ser. No. 07/965,190, filed Oct. 23, 1992, now abandoned, the latter two applications are in turn continuations-in-part of U.S. patent application Ser. No. 07/807,439, filed Dec. 13, 1991, now abandoned.

BACKGROUND OF THE INVENTION

1. Field of the Invention

The present invention pertains to the field of dielectrics and, more specifically, doped ABO$_3$ perovskite-type dielectrics that are utilized in thin-film capacitors for integrated circuits and the like. More particularly, the invention involves materials and methods for fabricating dielectric compositions that are utilized in thin-film capacitors and integrated circuit components such as DRAMS. These materials are formed in liquid deposition processes using polyoxalkylated metal complexes having dopants in a stoichiometric balance corresponding to an average crystalline formula.

2. Statement of the Problem

As will be understood by those skilled in the art, most crystalline materials having an ABO$_3$ formula are perovskite crystalline compounds. These structures ideally have a unit cell forming a simple cubic structure including A-type cations at the corners of a cube, a B-type cation at the centroid of the cube, and oxygen atoms entered at each facial plane of the cube; however, this idealized structure may vary considerably with temperature. Other forms of perovskite-type compounds can be classified, for example, as orthombic, pseudocubic, pseudotetragonal, rombohedral, and tetragonal. Perovskites are noted for exhibiting strong ferroelectric and dielectric behavior, though not all perovskites exhibit these behaviors.

The ABO$_3$ structure may be composed of respective A and B elements having different valences. Even so, these A and B site elements typically remain coupled with a ternary oxide. Known A-B ternary oxides include $A^{+1}B^{+5}$ materials (e.g., potassium niobate), $A^{+2}B^{+4}$ materials (e.g., strontium titanate or barium titanate), $A^{+3}B^{+3}$ a materials (e.g., gadolinium iron oxide), complex oxides of the type $A^{+2}(B^{+3}_{.67}B^{+}_{6.3})$ (e.g., $Sr(Cr_{0.67}Re_{.33})$, complex oxides of the type $A^{+2}(B^{+}3_{0.5}B^{+5}_{0.5})$, and numerous other complex oxides.

Materials such as barium strontium titanate ("BST") exhibit electrical properties that are often very different when measured from bulk ceramics, as compared to thin-film materials (i.e., those less than about ten microns thick) that are used in integrated circuits. Bulk ceramics are typically sintered at temperatures reaching from 1400° C. to 1500° C., and this high temperature tends to produce a correspondingly high degree of defect-free crystallization. On the other hand, thin-films are generally not sintered above about 900° C. to 1100° C. due to the potential for breakdown of integrated circuit wiring, layer interdiffusion, and cracking. Thin-films are most often deposited by conventional sputtering techniques, e.g., radio frequency or DC magnetron sputtering. On a microscopic level, these techniques can provide clumped areas of massed materials having nonuniform thicknesses, stratified layers that are improperly mixed to non-homogeneic proportions that are incapable of forming proper average crystals according to the mixture of ingredients. Accordingly, those attempting to replicate bulk ceramic behavior in thin film electronic components have often been unable to duplicate these parameters, even if the electron transfer mechanism remains the same between the two thicknesses of materials.

Metal oxide films have been formed from sol-gels, i.e., a metal alkoxide solution which is partially hydrated to form a partial gel. The sol-gels are applied to a semiconductor substrate to form a film, and then decomposed to form a metal oxide. One such method comprises the application of a sol-gel to a substrate followed by heat treatment. The heat decomposes the sol-gel and drives off the organics to form the metal oxide. See for example, U.S. Pat. No. 5,028,455 issued to William D. Miller et al., the Joshi article cited above, and B. M. Melnick, et al., "Process Optimization and Characterization of Device Worthy Sol-Gel Based PZT for Ferroelectric Memories", in *Ferroelectrics*, Vol 109, pp. 1–23 (1990). Nevertheless, the addition of water to these solutions induces substantial viscosity increases, and the prepared solutions are sensitive to environmental water (e.g., atmospheric water) that may significantly shorten shelf life due to substantial gelling of the hydrated solution and even precipitation of metals from solution. These factors often make the sol-gel solutions poorly suited for use in the fabrication of thin-film electronic components.

In another method, what has been termed a "MOD" solution is applied to a substrate followed by heating which decomposes the MOD solution and drives off the organics to form the metal oxide. See "Synthesis of Metallo-organic Compounds for MOD Powers and Films", G. M. Vest and S. Singaram, *Materials Research Society Symposium Proceedings*, Vol. 60, 1986 pp. 35–42 and "Metalorganic Deposition (MOD): A Nonvacuum, Spin-on, Liquid-Based, Thin Film Method", J. V. Mantese, A. L. Micheli, A. H. Hamdi, and R. W. Vest, in *MRS Bulletin*, October 1989, pp. 48–53.

Metal oxide materials such as BST are important materials for making integrated circuit thin film capacitors having high dielectric constants. Such capacitors are useful in fabricating integrated circuit memories such as DRAMs. See for example, Kuniaki Koyama et al., "A Stacked Capacitor with $(Ba_xSr_{1-x})TiO_3$ For 256M DRAM" in IDEM (International Electron Devices Meeting) *Technical Digest*, December 1991, pp. 32.1.1–32.1.4, and U.S. Pat. No. 5,122,923 issued to Shogo Matsubara et al. The capacitors used in a DRAM integrated circuit are the predominant element determining the size of each DRAM cell.

Capacitor size requirements presently constitute a limiting factor in further reductions of DRAM cell size. A reduction in DRAM cell size is essential to further significant increases in DRAM cell densities for use in an integrated circuit, but this size reduction advantage will require a further reduction in the size of the cell capacitor. Reduction of the capacitor size can be achieved by increasing the dielectric constant of the material used in the dielectric layer of the capacitor, in order to permit the use of a smaller surface area in a capacitor having the desired dielectric properties. Prior methods for increasing the dielectric constant of materials have met with failure because these methods also increased the leakage current and the corresponding conductive current density of the dielectric material at fixed bias voltages. Excessive leakage current or conductive current density renders the material unfit for capacitors in integrated circuits and, in particular, unfit for capacitors in DRAM cells. It remains a problem in the field to increase the dielectric constant of materials, even for high dielectric constant material, such as BST, without significantly increasing the leakage current.

SOLUTION TO THE PROBLEM

The invention overcomes the problems that are outlined above by providing specially doped $ABO_3$ perovskite-type dielectric compositions having high dielectric constants and low conductive leakage currents or current density values, as well as methods and materials for producing these compositions. The preferred compositions and methods utilize precursor solutions having dopants in a special stoichiometric balance with A and B site materials to compensate or reduce the incidence of dopant-induced crystalline defects in the resultant dielectric composition. Alternatively, the uncompensated dopants decorate or oxidize intracrystalline grain boundaries. The methods and materials hereof are especially useful in the manufacture of thin-film capacitors for use in integrated circuits.

Precursor solutions for use in fabricating $ABO_3$ perovskite-type, dielectric, thin-film capacitor layers of integrated circuits and the like, may be produced according to a method broadly including the steps of furnishing an A-site portion, supplying a B-site portion, providing a dopant portion including a dopant selected from the group of A and B-site metals, and mixing these portions to substantial homogeneity. The respective portions each preferably include a polyoxyalkylated metal complex including an alkoxide or carboxylate ligand bonded with a corresponding A-site metal, B-site metal, or dopant. These polyoxyalkylated metals are preferably selected from a group consisting of metal alkoxides, metal carboxylates, metal alkoxycarboxylates, and mixtures thereof. The polyoxyalkylated precursors are themselves typically formed from pre-precursors including metal alkoxide and metal carboxylate reagents that remain as part of the solution due to organic reaction efficiency, which is presumed to be about 60–90%. These preprecursors include metal isopropoxides, metal 2-ethylhexanoates, metal neodecanoates, metal octanoates, or a mixture of these organic materials. The solutions should preferably be kept essentially water free due to problems with polymerization or gelling and precipitation of metal compounds that are associated with the introduction of water to these precursor solutions. These solutions work best in liquid deposition processes if they are kept essentially free of polymerization or gelling.

Metal alkoxycarboxylate complexes and polyoxyalkylated metals having a —O— M—O—M—O— group are particularly preferred for use in these precursor solutions, due to the improved electrical performance that is exhibited by metal oxides produced from these types of chemicals. It is believed that these formulas typically permit the metals to form at least 50% of their metal-to-oxygen bonds in-situ prior to a drying step and an annealing step, and the advance bond formation significantly improves the ultimate crystalline structure in dielectric materials formed from these precursors.

Generally, in metal oxides having the formula $ABO_3$, there is at least one A-site atom and at least one B-site atom combined with three oxygen atoms, which is sufficient to produce a 1:1:3 stoichiometric ratio in the stable average crystalline formula. The single A-site atom or single B-site atom may be substituted with a mixture of A-site (e.g., A and A') or B-site atoms (e.g., B and B') in relative proportions sufficient to preserve the general ratio. This ratio may be expressed as a formula template $A_xA'_{1-x}BO_3$ indicating that the total of A-site atoms equals one (X +1−X=1) combined with one B-site atom and three oxygen atoms. Therefore, though the total numbers of lattice-situated A-site and B-site atoms are respectively fixed by the stoichiometric formula, the ratio of A to A' A-site atoms may be expressed as the ratio X/(1-X).

The A-site portion, B-site portion, and dopant portion are preferably mixed in respective molar proportions sufficient to balance a ternary oxygen charge in a thin-film, $ABO_3$ perovskite, dielectric layer to be formed from the solution. It is believed that this charge balancing serves to reduce crystalline defects by compensating for the presence of dopant in the perovskite-type dielectric layer. The lowdefect crystals have especially good properties when used as dielectric materials.

It should be understood that the term "mole %" refers to a concentration of a specific ingredient or substituent in a molecular formula or average crystalline formula. For example, a ten mole percent dopant is such that ten moles of the final crystal contains one mole of the dopant. Where the dopant is ten percent $DyO_{3/2}$ in BST, the average crystalline formula would be $Ba_{+2}^{0.666}Sr_{+2}^{0.285}Dy_{+}^{0.100}Ti_{+4}^{0.950}O_3$. The precursor solution should reflect relative molar proportions of polyoxyalkylated metals in amounts equivalent to the stoichiometric crystalline formula after accounting for potential evaporation and sublimation losses in the manufacturing process.

The most preferred charge balancing method requires that the precursor solution have respective molar proportions equating to X1, X2, X3, X4, and X5 for a perovskite-type crystalline structure (to be formed from the precursor) having an average formula of the type:

$$A_{X1}^{V1}A'_{X2}^{V2}D_{X3}^{V3}D'_{X4}^{V4}B_{X5}^{V5}O_3,$$

wherein A and A' and are A-site cations preferably selected from an A-site group consisting of Ba, Bi, Sr, Pb, La, Ca, and mixtures thereof; B is a B-site cation preferably selected from a B-site group consisting of Ti, Zr, Ta, Mo, W, Nb, and mixtures thereof; D is a first dopant preferably selected from a dopant group consisting of all A-site and B-site metal cations and mixtures thereof; D' is a second dopant having a B-site metal when D is a B-site metal, and an A-site metal when D is a B-site metal; X1, X2, X3, X4 and X5 are respective stoichiometric molar portions of elements in the formula, with X1, X3, and X5 each being greater than zero, and X2 and X4 being any proportion including zero; V1, V2, V3, V4, and V5 are whole numbers equal to respective outer electron shell valences corresponding to the elements of the formula; and $O_3$ is a ternary oxygen moiety. The formula substantially obeys an oxygen moiety charge balance relationship

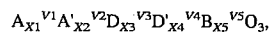

X1*V1+X2*V2+X3*V3+X4*V4+X5*V5=6±0.6.

It is even more preferred that the formula obey the charge balancing relationship

X3*V3=X4 *V4, which serves to fully compensate the crystalline formula for the added dopant and prevent stoichiometric excess of A or B-site materials.

In these crystalline compositions, the dopant D may have a valence V3 greater than either of V1 or V2. In this case D will induce A-site sublattice vacancies in the perovskite-type crystalline structure, which A, A', and D' will compensate by bonding with neighboring A-site cations. Here, D can be present in amounts up to about 30 mole % of the crystalline structure.

The dopant D may have a valence V3 less than either of V1 or V2. In this case, D induces oxygen sublattice vacancies in the perovskite-type crystalline structure, and D' compensates for these vacancies by bonding with neighboring oxygen sublattice members. Here, D may be present in an amount up to 10 mole % of the crystalline composition.

The dopant D may have a valence V3 greater than V4. In this case, D induces A-site sublattice vacancies in the perovskite-type crystalline structure, which A, A, and D' compensate by bonding with neighboring A-site sublattice members. Here, D is preferably present in an amount up to 30 mole % of the formula.

The dopant D may have a valence V3 less than V4, which allows D to induce oxygen sublattice vacancies in the perovskite-type crystalline structure. Here, A, A, and D' compensate for these vacancies by bonding with neighboring oxygen sublattice members. In this case, D' is preferably present in a combined amount totaling up to 10 mole % of the formula.

D and D' are preferably combined in equimolar amounts for purposes of compensating both A and B-site defects; however, this equimolar combination is not required, particularly when D and D' have different valence states. Furthermore, it may be desirable to provide an excess of either D or D', i.e., and excess of A or B-site material, for use in crystals that are prone to either A or B-site lattice defects.

The generalized reaction chemistry for the formation of liquid solutions of metal alkoxides, metal carboxylates, and metal alkoxycarboxylates for use in producing the metal precursor portions is as follows:

alkoxides—$M^{+n}$+n R—OH→$M(O—R)_n$+n/2 $H_2$ (1) 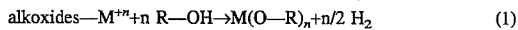

carboxylates—$M^{+n}$+n (R—COOH)→$M(OOC—R)_n$+n/2 $H_2$ (2) 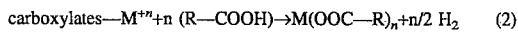

alkoxycarboxylates—$M(O—R')_n$+b R—COOH+heat→ $(R'—O)_{n-b}M(OOC—R)_b$+b HOR, (3) 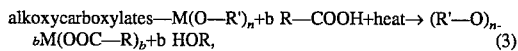

where M is a metal cation having a charge of n; b is a number of moles of carboxylic acid ranging from 0 to n; and R and R' are respective alkyl substituents having carbon chains of from about 3 to 18 carbons.

In the precursor formation process, the mixing step may be conducted in any order with respect to combination of the A-site, B-site, and dopant portions. By way of example, the B-site portion may be provided first, followed by additional oxygenated organic material (e.g., 2-ethylhexanoic acid) and an A-site element as reagents to form the A-site portion in the same mixture with the B-site portion. Alternatively, the dopant portion may be mixed first, but this is less preferred where the dopant is much less electropositive than are the A and B-site metals. Large differences in electronegativity, in combination with the dilute dopant concentrations, could reduce the amount of dopant present as a polyoxyalkylated metal complex. Accordingly, it is preferred, though not required, to produce the dopant portion separately from any mixture of A-site and B-site portions.

The A-site portion is preferably formed by reacting with an alcohol or carboxylic acid at least one A-site element selected from an A-site group consisting of Ba, Bi, Sr, Pb, La, Ca, and mixtures thereof. Particularly preferred A-site elements include mixtures of Ba and Sr for use in BST dielectrics, which are particularly preferred due to their stable crystalline structure subsequent to a liquid deposition process. Most preferably, the A-site portion includes an A-site having a total number of A-site atoms having from about 30% to about 70% barium atoms, and from about 30% to about 70% strontium atoms.

The B-site portion is preferably produced by reacting with an alcohol or carboxylic acid at least one B-site element selected from a B-site group consisting of Ti, Zr, Ta, Mo, W, Nb, and mixtures thereof. Titanium is a particularly preferred B-site element for use in BST dielectrics.

The dopant and dopant compensator portions are preferably produced by reacting an alcohol or carboxylic acid with at least one dopant and at least one dopant compensator. The dopants and dopant compensators may be selected from a group including all metals and mixtures thereof, but the alkaline earth and rare earth metals are preferred. Particularly preferred dopants include A-site group dopants (Ba, Bi, Sr, Pb, La, Ca) and B-site dopants (Ti, Zr, Ta, Mo, W, Nb).

As understood by those skilled in the art, the term "dopant" often means an impurity that may induce hole conduction or one that may induce electron conduction, i.e., an "n" or "p" type dopant. More generally, the term "doping" means the addition of impurities or the deviation from a stoichiometric composition to produce a desired characteristic. As used herein, the term "dopant" means an impurity metal capable of functioning as either an A-site or B-site material in an incremental amount exceeding a 1:1:3 stoichiometric balance in the majority $ABO_3$-type crystalline lattice, or as an impurity metal that 'decorates' or oxidizes the intracrystalline grain boundaries.

In dopants of the type that may be an A or B-site-type element, a "dopant compensator" or D' is an additional amount of corresponding B or A-site material required to maintain the overall $A:B:O_3$ ratio of 1:1:3, where A and B here include their associated A and B-type dopants and dopant compensator materials. At least one of the dopant and dopant compensator should different from the A or B-site elements of the majority constituent $ABO_3$-type lattice. Even so, it is not necessary that both the dopant and dopant compensator be different from the A or B-site elements of the majority lattice.

Precursor solutions having dopants comprising stoichiometrically excess amounts of A or B site materials will typically cause the excess A or B site materials to decorate or oxidize the intracrystalline grain boundaries, because the dopant (or other less stable A or B-site crystalline element) will not be incorporated in the A-B lattice. Nevertheless, dopants in quantities exceeding about one to five mole % can cause crystal modifications to arise. Mixtures of Ce, Mn, Dy, and/or Cr are particularly preferred in A and B-site uncompensated perovskites having dopants of the type that work at intracrystalline grain boundaries. The presence of dopants at intracrystalline grain boundaries can serve to reduce the incidence of electron transfer, thereby reducing the leakage current.

In precursor formation, the mixing step preferably includes adding a solvent to improve solution viscosity and ease homogeneic distribution of the respective precursor portion fractions. Preferred solvents include alcohols, aromatic hydrocarbons, and esters. Particularly, preferred solvents include those selected from the group consisting of 2-methoxyethanol, xylene, and N-butyl acetate, with xylene being most preferred. Additionally, this mixing step is preferably conducted by stirring under a desiccated or essentially water-free inert atmosphere, such as an argon atmosphere. Nitrogen atmospheres are also essentially unreactive with these solutions.

Another embodiment of the invention pertains to methods for using a liquid precursor solution of a type produced by the method described above in the manufacture of thin-film dielectric capacitors, DRAMS and the like. The method steps include providing a first substrate and a precursor solution having an A-site portion, a B-site portion, and a dopant portion, as described above. These portions are present in respective concentrations sufficient to form a thin-film dielectric layer of crystalline material on the first substrate. The first substrate is contacted with the precursor solution to form a precursor-exposed substrate having a surface coated with a precursor film. This contacting step preferably includes a spin-on deposition or a mist deposition. Thereafter, the film is thermally treated to remove substantially all organic portions, and to induce perovskite-type crystalline growth forming the dielectric layer.

In this manufacturing process, the treating step preferably includes heating the precursor-exposed substrate to a temperature from about 100° C. to about 500° C. in a dried air or nitrogen-based atmosphere having less than 35% humidity for a period of time sufficient to remove organic residue from the film to form a dried substrate and, thereafter, annealing the dried substrate in an oxygen atmosphere at a temperature ranging from about 600° C. to about 900° C. for a period of time sufficient to sinter the film. The treating step may also include sputtering, e.g., radio frequency sputtering, of the dielectric crystalline material for thin-film deposition upon a second substrate.

Yet another aspect of the present invention pertains to materials that may be constructed according to the above-described methods, and especially thin-film capacitors for use in DRAMS or, generally, in integrated circuits. A precursor solution is formed having an A-site portion, a B-site portion, and a dopant portion as described above.

One such material, as may be produced by the present invention, is a high dielectric constant, low leakage current, crystalline composition for use in electronic components such as integrated circuits, thin film capacitors and the like. The material has an $ABO_3$ perovskite-type structure wherein A is an A-site moiety including a mixture of barium and strontium, B is a B-site moiety including titanium, and $O_3$ is a ternary oxygen moiety. The material also includes a dopant having a mixture of cerium and at least one other element selected from a group consisting of manganese, chromium, and mixtures thereof. The dopant is present in a quantity sufficient to alter or modulate a leakage current over a bias voltage domain, as compared to a similar capacity in a non-doped control sample. This alteration is typically characterized by the shifting of an onset of a dominant electron emission type to a different voltage value, such as an emission-type changeover from a field emission to a Schottky-type emission. The emission-type changeover can be characterized by a substantial change (e.g., greater than about 20%) in the generalized linear slope of a line segment plotted as conductive current density versus bias voltage.

In preferred embodiments, these compositions are BST materials having a dopant quantity ranging from about 0.1 to about 10 mole %, for the intracrystalline boundary dopants, and up to about 30% for the A and B-site dopants. Especially preferred dopants include combinations of cerium, manganese, dysprosium, and/or chromium moieties in BST, yields especially improved capacitor formulations having low leakage current values.

DETAILED DESCRIPTION OF THE INVENTION

An important feature of the invention is the ease with which specific stoichiometric solutions and dielectric materials can be produced. In the prior art, the precise dopant level achieved would be significantly less predictable and less uniform when compared to that achieved using the methods of the present invention, due to inherent randomness in prior processes such as sputtering. Rather, in the prior art, one would fabricate a device then test it to see what concentration was obtained. In contrast, the present method permits component fabrication that utilizes precise, uniform, and repeatable excess A-site and B-site material concentrations, and these concentrations are easily obtained in the form of liquid precursor solutions. Furthermore, the use of precursor solutions enables the application of thin films having a homogeneic distribution of the respective metal constituents that will ultimately form the metal oxides of integrated circuits. Accordingly, the present invention lends itself to manufacturing much more readily than the did prior methods.

Figure 1:
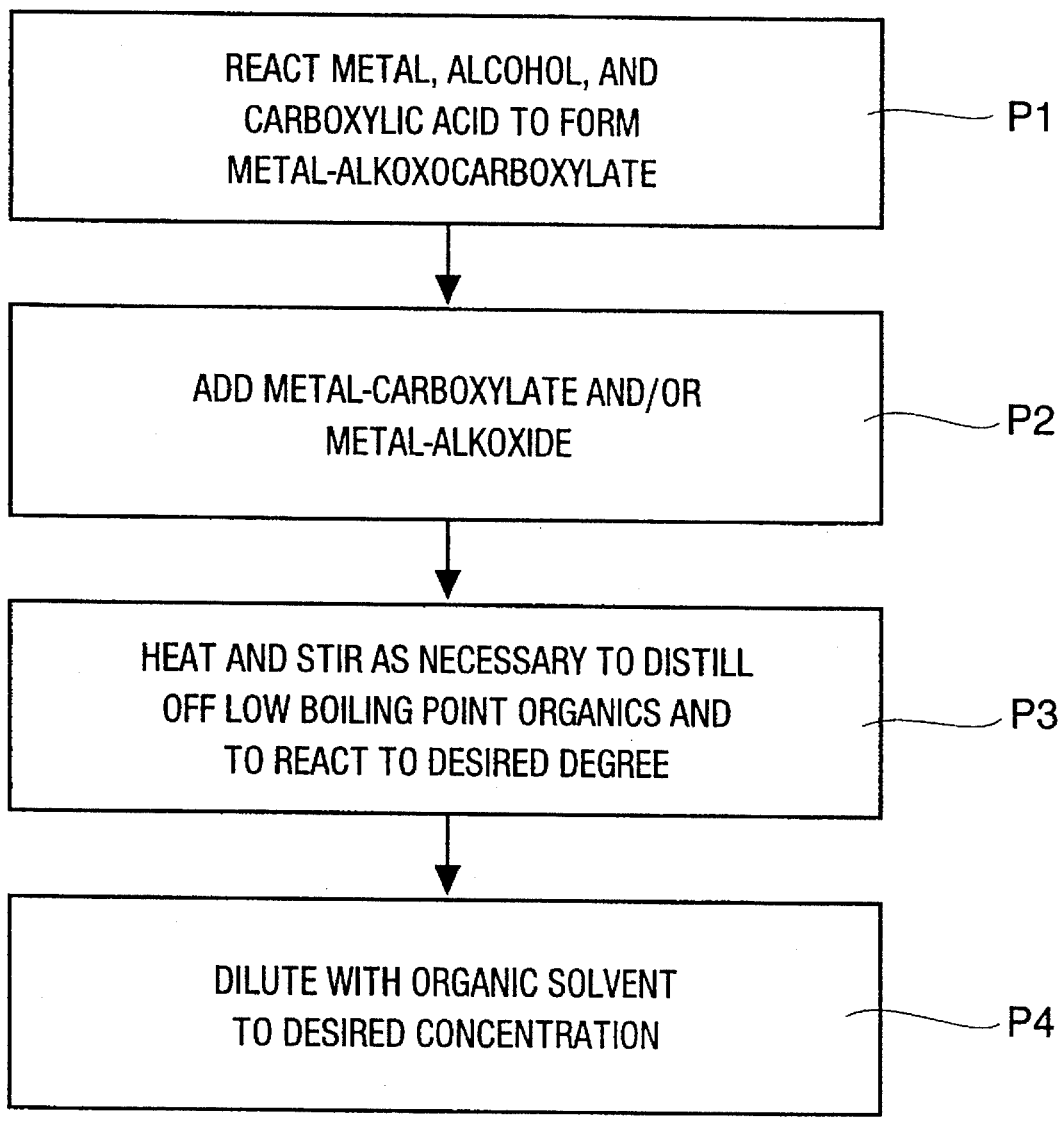
FIG. 1 is a first process schematic diagram for the production of BST precursor solutions according to the present invention.

FIG. 1 depicts a flow chart of a generalized process according to the invention for forming a liquid precursor solution for fabricating thin films. The word "precursor" is often used ambiguously in this art. It may mean a solution containing one metal or a solution containing several metals which can be applied to a substrate. In this discussion we shall generally refer to the individual precursors as "initial precursors" and the precursor as applied to the substrate as the "final precursor" or just "precursor," unless the meaning is clear from the context. In intermediate stages the solution may be referred to as the "intermediate precursor".

In step P1 a first metal, indicated by the term M or M' in the equations below, is reacted with an alcohol and a carboxylic acid to form a metal-alkoxycarboxylate initial precursor. The preferred general process for preparing polyoxyalkylated metal precursors is provided in application Ser. No. 08/132,744 filed Oct. 6, 1993, which is hereby incorporated by reference herein. The process preferably includes reacting a metal, such as barium, strontium, or titanium, with an alcohol (e.g., 2-methoxyethanol) to form a metal alkoxide, and reacting the metal alkoxide with a carboxylic acid (e.g., 2-ethylhexanoic acid) to form a metal alkoxycarboxylate or metal alkoxide having a —O—M—O—M—O— bond according to one of the generalized formulas (R'—COO—)$_a$M(—O—R)$_n$, or (R'—C—O)$_a$—M—(O—M'—(O—C—R")$_{b-1}$)$_n$, wherein M is a metal having an outer valence of (a+n) and M' is a metal having an outer valence of b, with M and M' preferably being independently selected from the group consisting of tantalum, calcium, bismuth, lead, yttrium, scandium, lanthanum, antimony, chromium, thallium, hafnium, tungsten, niobium, zirconlure, manganese, iron, cobalt, nickel, magnesium, molybdenum, strontium, barium, titanium, and zinc; R' is an alkyl group having from 4 to 15 carbon atoms and R is an alkyl group having from 3 to 9 carbon atoms. Of course, even though the use of substances according to these formulas are more preferred, mixtures of metal alkoxides, metal carboxylates, and metal alkoxycarboxylates in any proportion are acceptable for use in precursor solutions. Alcohols that may be used preferably include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Carboxylic acids that may be used preferably include 2-ethylhexanoic acid, octanoic acid, and neodecanoic acid, preferably 2-ethylhexanoic acid. The metal alkoxycarboxylates are preferred. These materials may be heated in the presence of excess carboxylic acid to substitute carboxylate ligands for a portion of the alkoxide ligands.

In a typical second step, P2, a metal-carboxylate, a metal-alkoxide or both may be added to the metal-alkoxycarboxylate. Any of the metals listed above reacted with any of the carboxylic acids listed above may form the metal carboxylate, while any of the metals listed above reacted with any of the alcohols may form the alkoxide.

In step P3 the mixture of metal-alkoxycarboxylate, metal-carboxylate and/or metal-alkoxide is heated and stirred as necessary to form metal-oxygen-metal bonds and boil off any low-boiling point organics that are produced by the reaction. Preferably, at least 50% of the metal to oxygen bonds of the final desired metal oxide are formed by the end of this step.

According to a generalized reaction theory, if a metal-alkoxide is added to the metal-alkoxycarboxylate, and the solution is heated, the following reactions occur:

(R—COO)$_x$—M—(O—C—R')$_a$+a M'—(O—C—R")$_b$→
(R—COO)$_x$—M—(O—M'—(O—C—R")$_{b-1}$)$_a$+a R'—C—O—C—R"     (4)

(R—COO)$_x$—M—(O—C—R')$_a$+x M'—(O—C—R")$_b$→ (R'—C—O)$_a$—M—(O—M'—(O—C—R")$_{b-1}$)$_x$+x R—COO—C—R"     (5)

where M and M' are metals; R and R" are alkyl groups preferably having from zero to sixteen carbons; and a and b are integers denoting relative quantities of corresponding substituents. Generally the reaction of equation (4) will occur first since metal alkoxides react more readily than metal carboxylates. Thus, ethers having low boiling points are generally formed. These ethers boil out of the precursor, thus leaving a final precursor having a reduced organic content and the metal-oxygen-metal bonds of the final desired metal oxide already partially formed. If the heating is sufficient, some of the reaction (5) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

If a metal-carboxylate is added to the metal-alkoxycarboxylate and the mixture is heated, the following reaction occurs:

(R—COO)$_x$—M—(O—C—R')$_a$+x M'—(OOC—R")$_b$→ (R'—C—O)$_a$—M—(O—M'—(OOC—R")$_{b-1}$)$_x$+x R—COOOC—R'     (6)

where R—COOOC—R' is an acid anhydride, and the terms are as defined above. This reaction requires considerably more heat than do the reactions (4) and (5) above, and proceeds at a much slower rate.

In addition to the above reactions which produce metal-alkoxycarboxylates, reactions occur such as:

M(OR)$_a$+a HO$_2$C$_8$H$_{15}$+heat→M(O$_2$C$_8$H$_{15}$)$_a$+a HOR, where the terms are as defined above. This reaction, with heating in the presence of excess carboxylic acid, substitutes the alkoxide part of the intermediate metalalkoxycarboxylate to form a full carboxylate; however, it is now believed that a complete substitution of the alkoxides by the carboxylates does not occur with the parameters as disclosed herein. Full substitution of the carboxylates requires significantly more heating, and even then may not readily occur.

In step P4, the solution is diluted with an organic solvent to produce a final precursor having the desired concentration. A solvent exchange step may take place simultaneously or subsequently for purposes of changing the solvent portion of the precursor mixture. Solvents that may be used include: xylenes, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene as well as many others. Xylene is a particularly preferred apolar solvent, and n-butyl acetate is a particularly preferred polar solvent. The final precursor solution will contain various polyoxyalkylated metals in a stoichiometric balance capable of forming the desired solid metal oxide material after accounting for element-specific evaporation or sublimation losses in the manufacturing process.

The above exemplary reaction summary is generalized and, therefore, non-limiting. The specific reactions that occur depend on the metals, alcohols, and carboxylic acids used, as well as the amount of heat that is applied. It is noted that any combination of polyoxyalkylkated metal complexes (as described above) may be used to practice the invention, but combinations of metal alkoxides, metal carboxylates, and metal alkoxycarboxylates are preferred. Detailed examples will be given below.

The following non-limiting examples set forth preferred materials and methods for practicing the invention hereof.

EXAMPLE 1

Preparation of a Non-Doped "Stock" BST Precursor Solution

Figure 2:
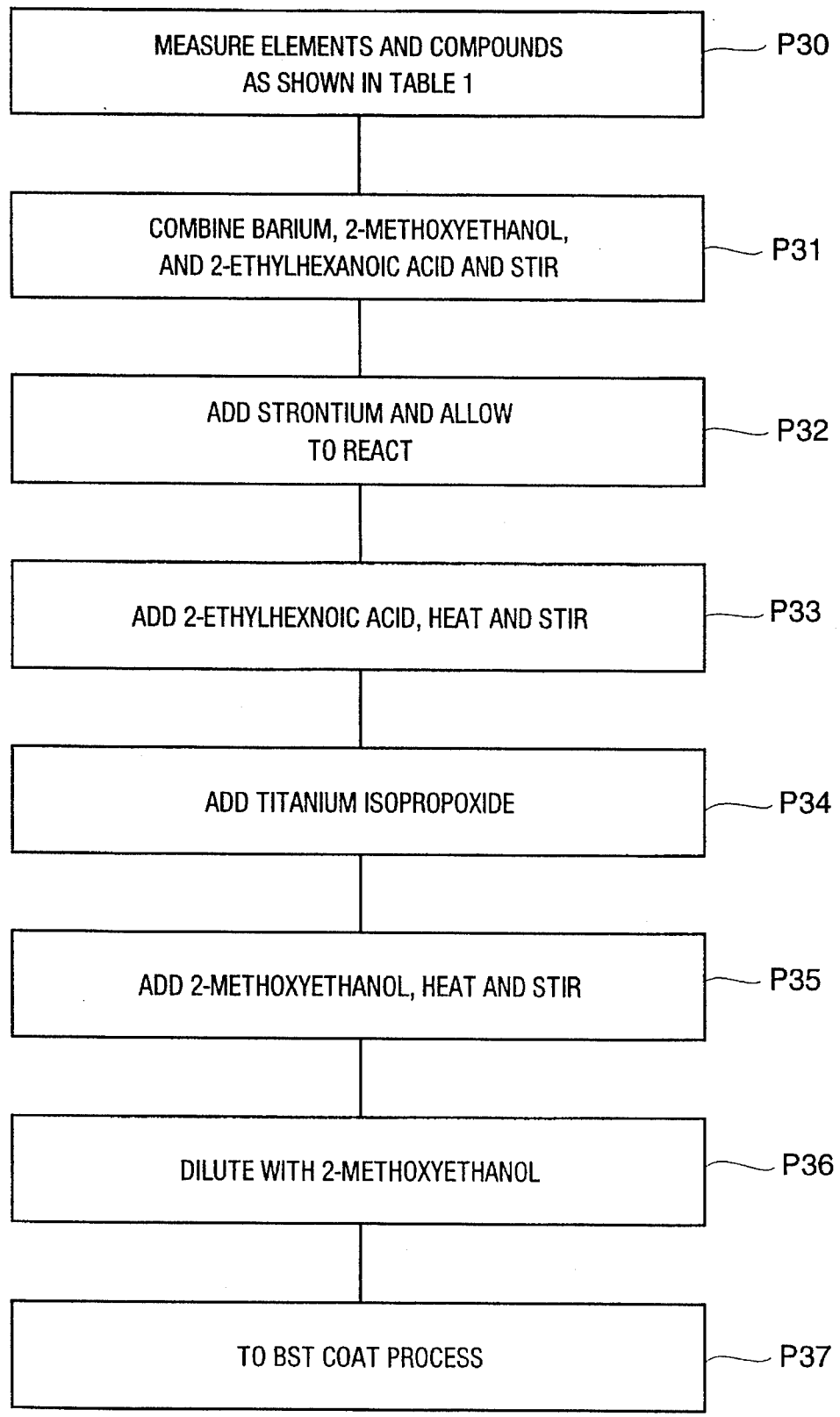
FIG. 2 is a second process schematic diagram for the production of BST precursor solutions, and provides additional detail with respect to FIG. 1.

A detailed example of the process of preparing the precursors used to deposit barium strontium titanate (BST) is given below. Referring to FIG. 2, in step P30, the compounds shown in Table 1 were measured.

TABLE 1

Major Reagents For A Precursor Capable of Producing Barium Strontium Titanate (BST) - $Ba_{0.7}Sr_{0.3}TiO_3$

| Compound | FW | g | mmole | Equiv. |
|---|---|---|---|---|
| Barium | 137.33 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 144.21 | 8.5005 | 88.945 | 0.6010 |
| Titanium Isopropoxide | 284.26 | 27.878 | 98.072 | 1.0000 |

In Table 1, "FW" indicates formula weight, "g" indicates grams, "mmoles" indicates millimoles, and "Equiv." indicates the equivalent number of moles in solution.

In step P31 the barium was placed in 100 ml (milliliters) of 2-methoxyethanol under an inert argon atmosphere. The 2-ethylhexanoic acid was added and the mixture was allowed to react while stirring. This step may also be performed by placing the barium in the 2-methoxyethanol, allowing it to react, adding the 2-ethylhexanoic acid, and stirring while the mixture reacts. In either case the reaction is described by the following equation:

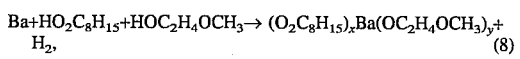

where $HO_2C_8H_{15}$ is 2-ethylhexanoic acid, $HOC_2H_4OCH_3$ is 2-methoxyethanol, $(O_2C_8H_{15})$ is the carboxylate ligand, $(OC_2H_4OCH_3)$ is the alkoxide ligand, and x and y indicate the number of each ligand that is bonded to the barium. Usually, both x and y are 1. $H_2$, hydrogen gas, is a by-product of the reaction and escapes from the solution. The exothermic reaction of the barium heated the solution.

While the solution was still hot, the strontium was added in step P32 and allowed to react. The heat in solution from the barium reaction assisted the strontium reaction.

When the strontium was all reacted, then, in step P33, the second measure of 2-ethylhexanoic acid was added, and the solution was stirred while heating for several hours at a maximum temperature of 115° C. This ensured that any water present was distilled out, and was believed to result in a similar reaction to that of equation (8) except that Sr replaced Ba.

The mixture was then allowed to cool, and in step P34 the titanium isopropoxide was added followed by the addition of enough 2-methoxyethanol in step P35 to make 220 ml of total solution. The solution was then heated and stirred with the following reactions:

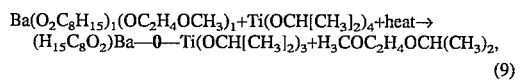

and

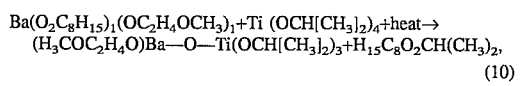

where Ti $(OCH[CH_3]_2)_4$ is titanium isopropoxide, $H_3COC_2H_4OCH(CH_3)_2$ is 2-methoxy-ethoxy-isopropyl ether, and $H_{15}C_8O_2CH(CH_3)_2$ is isopropyl 2-ethylhexanoate, an ester. Similar reactions occurred for the strontium-containing portion.

The ethers and some esters could be smelled during this reaction. The ethers were low boiling point liquids and generally boiled out of solution while the esters were higher boiling point liquids, which tended to remain in solution. During the heating, the maximum temperature was 116° C., which also ensured that substantially all isopropanol and water were distilled out. The resultant solution was diluted to 200 ml total solution with additional 2-methoxyethanol in step P36. The result was a final BST precursor having a 0.490 molar concentration with the ratio of barium to strontium equalling 0.69986: 0.30014. The solution was then ready for use in a BST coating process for thin-film capacitor formation. This process was repeated as additional quantities of the BST precursor were required.

In this Example, barium and strontium 2-ethylhexanoate were utilized because thin films formed utilizing medium chain-length carboxylates like these in the precursors do not crack, blister or peel upon baking as do the thin films formed utilizing longer-chain carboxylates. Strontium and barium 2-methoxyethoxide were tried, but proved excessively sensitive to air and water. Titanium 2-methoxyethoxide provides better films than do the air-insensitive titanium 2-ethylhexanoate, but while titanium 2-methoxyethoxide is air-sensitive, it is less air-sensitive than titanium isopropoxide.

EXAMPLE 2

Solvent Exchange

In Example 1, the use of 2-methoxyethanol as a solvent allowed the removal of substantially all water, if any water was present, by distillation as the higher boiling point of 2-methoxyethanol allowed it to remain in solution while the water distilled away. Nevertheless, a xylene solvent has advantages in step P37, i.e., the BST coating process. These advantages include solution viscosity control and the use of a common or standardized solvent in all coating activities. For example, a room temperature 0.35M BST precursor solution spin-coated upon a typical silicon substrate at about 1500–2000 RPM will produce a final BST layer about 1500

Å thick after two such applications through to final sintering. Substantial variations in solvents, solution concentrations, apparent viscosities, and temperature will lead to different results.

While it is not absolutely necessary to do so, step P4 (FIG. 1) preferably includes a solvent exchange step. This solvent exchange primarily substitutes a solvent that has a viscosity appropriate for the application process, e.g., the preferred "spin-on" process, using an initial solvent that is convenient for manufacturing the liquid stock solution and/or which makes a precursor that stores well. An appropriate viscosity herein preferably means a lower viscosity than the stock solution. In this solvent exchange, xylene is most preferably exchanged for the 2-methoxyethanol solvent of the BST stock solution.

Xylene was added to the stock solution of Example 1 in a quantity sufficient to yield a 0.35M final precursor solution, i.e., one having sufficient polyoxyalkylated metals to yield 0.35 mole of BST dielectric per liter of solution. The mixture was heated to about 130° C. while stirring to distill out substantially the entire 2-methoxyethanol portion. N-butyl acetate also works well as a production solvent, and may be substituted for xylene in this optional solvent exchange step.

EXAMPLE 3

Production of Non-Isovalently Doped Lattice Site Compensated Precursor Solutions A 3 ml aliquot of the xylene-containing 0.35M BST first metal precursor solution from Example 2 was obtained by pipette. Cerium 2-ethylhexanoate ($Ce^{+3}$) and chromium 2-ethylhexanoate ($Cr^{+3}$) were purchased from Strem Chemical of Newbury Port, Mass., and distilled to remove any naphtha portion. It is worth noting that $Ce^{+3}$ (an A-site metal moiety) has a crystalline ionic radius of about 1.034 Å as compared to $Ba^{+2}$ (1.34Å) and $Sr^{+2}$ (1.12 Å), and $Cr^{+3}$ (a B-site metal moiety) has a crystalline ionic radius of about 0.63 Å, as compared to $Ti^{+4}$ (0.68Å). These Ce and Cr carboxylates were combined with the stock BST solution of Example 2 to provide equimolar amounts of Ce and Cr at a concentration of 1 g CeCr per 0.14721 mmol solution. A 0.0713 g portion of the resultant CeCr-doped polyoxyalkylated mixture was weighed and mixed with the stock BST aliquot to produce a doped BST solution having relative stoichiometric proportions capable of producing a BST perovskite having one mole percent of CeCr moieties as dopants. The resultant doped BST precursor solution was stirred until the A-site portion (polyoxyalkylated Ba and Sr), the B-site portion (polyoxyalkylated Ti), and the dopant portion (polyoxyalkylated Ce and Cr) were distributed to substantial homogeneity within the xylene solvent.

Other cerium-doped precursors were produced by similar methods. A 2% CeCr doped precursor solution was produced by a method identical to the production of the 1% CeCr doped precursor solution, except that twice as much of the second (Ce and Cr-containing) precursor solution was used. Additional 1% and 2% doped precursor solutions were prepared as above, except that $Mn^{+3}$ 2-ethylhexanoate was substituted for $Cr^{+3}$ 2-ethylhexanoate.

Dysprosium-doped precursors were prepared beginning with commercially available dysprosium isopropoxide (from Strem Chemical). The commercial solution was reacted to substitute 2-ethylhexanoate for the isopropoxide portion according to equation (3) and the resultant dysprosium 2-ethylhexanoate was mixed with sufficient chromium 2-ethylhexanoate to produce respective 0.4% and 1.0% dopant portions having equimolar amounts of $Dy^{+3}$ and $Cr^{+3}$ in a 3 ml aliquot of the stock BST solution of Example 1.

A dopant portion including $La^{+3}$ and $Ta^{+5}$ may be constructed by combining lanthanum 2-ethylhexanoate and tantalum 2-ethylhexanoate in a 5:3 molar ratio. A dopant portion including $Dy^{+3}$ as D, and $Cr^{+3}$ plus excess $Ti^{+4}$ as D' may be prepared by mixing in these proportions of the metal 2-ethylhexanoate complex. Alternatively, the dopant portion (including D and D') may be reacted to form a metal alkoxycarboxylate complex, which is preferred over the metal 2-ethylhexanoate complex, especially for dopant concentrations exceeding about 5 mole %.

Table 2 includes a list of exemplary dopant-compensated BST solutions, and compares them to the general formula for the solid metal oxide product that will eventually be formed from these liquid precursors:

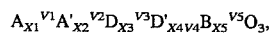

$$A_{X1}^{V1}A'_{X2}^{V2}D_{X3}^{V3}D'_{X4}^{V4}B_{X5}^{V5}O_3,$$

All of these precursor solutions can be prepared by the methods discussed above, and are suitable for use in manufacturing thin-layer capacitors. Each of these formulas substantially obeys the charge balancing relationship $$X1*V1+X2*V2+X3*V3+X4*V4+X5*V5=6+\sigma.$$

Of course, due to experimental or production uncertainties, it will seldom, if ever, be possible to engineer these solutions such that this sum equals exactly six. Accordingly, the above term σ indicates an acceptable range of error. It is preferred that σ is no more than about 0.6 or ten percent of the summed ionic charges. σ is more preferably no more than about one percent (0.06), and most preferably no more than about one-tenth of one percent (0.006).

TABLE 2

| | | Dopant Conc. (mole %) | $A_{X1}^{V1}$ | $A'_{X2}^{V2}$ | $D_{X3}^{V3}$ | $D'_{X4}^{V4}$ | $B_{X5}^{V5}$ |
|---|---|---|---|---|---|---|---|
| # | Formula | DOPANT-COMPENSATED PRECURSORS | | | | | |
| 1 | $Ba_{0.693}^{+2}Sr_{0.297}^{+2}Ce_{0.010}^{+3}Cr_{0.010}^{+3}Ti_{0.990}^{+4}O_3$ | 1 | $Ba_{0.693}^{+2}$ | $Sr_{0.297}^{+2}$ | $Ce_{0.010}^{+3}$ | $Cr_{0.010}^{+3}$ | $Ti_{0.990}^{+4}$ |
| 2 | $Ba_{0.686}^{+2}Sr_{0.294}^{+2}Ce_{0.020}^{+3}Cr_{0.020}^{+3}Ti_{0.980}^{+4}O_3$ | 2 | $Ba_{0.686}^{+2}$ | $Sr_{0.294}^{+2}$ | $Ce_{0.020}^{+3}$ | $Cr_{0.020}^{+3}$ | $Ti_{0.980}^{+4}$ |
| 3 | $Ba_{0.693}^{+2}Sr_{0.297}^{+2}Ce_{0.010}^{+3}Mn_{0.010}^{+3}Ti_{0.990}^{+4}O_3$ | 1 | $Ba_{0.693}^{+2}$ | $Sr_{0.297}^{+2}$ | $Ce_{0.010}^{+3}$ | $Mn_{0.010}^{+3}$ | $Ti_{0.990}^{+4}$ |
| 4 | $Ba_{0.686}^{+2}Sr_{0.294}^{+2}Ce_{0.020}^{+3}Mn_{0.020}^{+3}Ti_{0.980}^{+4}O_3$ | 2 | $Ba_{0.686}^{+2}$ | $Sr_{0.294}^{+2}$ | $Ce_{0.020}^{+3}$ | $Mn_{0.020}^{+3}$ | $Ti_{0.980}^{+4}$ |
| 5 | $Ba_{0.697}^{+2}Sr_{0.299}^{+2}Dy_{0.004}^{+3}Cr_{0.004}^{+3}Ti_{0.998}^{+4}O_3$ | 0.4 | $Ba_{0.697}^{+2}$ | $Sr_{0.299}^{+2}$ | $Dy_{0.004}^{+3}$ | $Cr_{0.004}^{+3}$ | $Ti_{0.996}^{+4}$ |
| 6 | $Ba_{0.693}^{+2}Sr_{0.297}^{+2}Dy_{0.010}^{+3}Cr_{0.010}^{+3}Ti_{0.990}^{+4}O_3$ | 1 | $Ba_{0.693}^{+2}$ | $Sr_{0.297}^{+2}$ | $Dy_{0.010}^{+3}$ | $Cr_{0.010}^{+3}$ | $Ti_{0.990}^{+4}$ |

TABLE 2-continued

DOPANT-COMPENSATED PRECURSORS

| # | Formula | Dopant Conc. (mole %) | $A_{X1}^{V1}$ | $A'_{X2}^{V2}$ | $D_{X3}^{V3}$ | $D'_{X4}^{V4}$ | $B_{X5}^{V5}$ |
|---|---|---|---|---|---|---|---|
| 7 | $Ba_{0.693}^{+2}Sr_{0.297}^{+2}Dy_{0.010}^{+3}Cr_{0.005}^{+3}Ti_{0.990}^{+4}O_3$ | 1 | $Ba_{0.693}^{+2}$ | $Sr_{0.297}^{+2}$ | $Dy_{0.010}^{+3}$ | $Cr_{0.005}^{+3}$ $Ti_{0.004}^{+4}$ | $Ti_{0.990}^{+4}$ |
| 8 | $Ba_{0.630}^{+2}Sr_{0.270}^{+2}La_{0.100}^{+3}Ta_{0.060}^{+5}Ti_{0.900}^{+4}O_3$ | 10 | $Ba_{0.630}^{+2}$ | $Sr_{0.270}^{+2}$ | $La_{0.100}^{+3}$ | $Ta_{0.060}^{+5}$ | $Ti_{0.900}^{+4}$ |
| 9 | $Ba_{0.630}^{+2}Sr_{0.270}^{+2}La_{0.067}^{+3}Ti_{1.000}^{+4}O_3$ | 10 | $Ba_{0.630}^{+2}$ | $Sr_{0.270}^{+2}$ | $La_{0.067}^{+3}$ | $Ti_{0.100}^{+4}$ | $Ti_{0.900}^{+4}$ |

*Here, D' includes a mixture of Cr and Ti.

EXAMPLE 4

Production of Lattice Site Uncompensated Precursor Solutions

A 3 ml aliquot of the xylene-containing 0.35M BST metal precursor solution from Example 2 was obtained by pipette. The aliquot was mixed with a sufficient quantity of dysprosium 2-ethylhexanoate to provide a 1 mole % dysprosium moiety in a stoichiometrically balanced average crystalline formula. This mixed sample had no D' moiety to compensate for the Dy dopant D. Other lattice site uncompensated precursor solutions were prepared in the same manner, with molar proportions as indicated in Table 3.

Table 3 includes a list of exemplary dopant-uncompensated BST solutions, and compares them to the general formula for the solid metal oxide product that will eventually be formed from these liquid precursors:

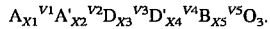

$$A_{X1}^{V1}A'_{X2}^{V2}D_{X3}^{V3}D'_{X4}^{V4}B_{X5}^{V5}O_3.$$

All of these precursor solutions can be prepared by the methods that are discussed above, and are suitable for use in manufacturing thin-layer capacitors.

atoms of impurities for any one element, or less than 10 parts per million. Relatively smaller amounts of impurities appear to give the best results in many cases. The normal level of impurity content in R&D grade BST may interfere with the desired dielectric properties. Moreover, small amounts of impurities can make a significant difference in the electrical properties; the material preferably should have impurities of 10 parts per million or less for each impurity element.

Table 4 contains the measured impurity levels in parts per million for the higher purity precursor solutions and the R&D grade precursor solutions. Where an entry is left blank the impurity was not specified.

TABLE 4

SOLUTION CONTAMINANT COMPARISON

| IMPURITY | HIGH PURITY SOLUTION Impurity Level in PPM | R & D SOLUTION Impurity Level in PPM |
|---|---|---|
| Na | 4.3 | 65 |
| K | 2.4 | 52 |
| Mn | 0.6 | 31 |
| Fe | <0.3 | 8 |
| Ni | 0.2 | |
| Mg | <0.1 | |
| Ca | 1.9 | |
| Zn | 0.1 | |
| Al | 0.3 | |
| Ag | <0.1 | |
| Cd | <0.1 | |
| Cu | 0.6 | |
| Li | <0.1 | |
| Mo | <2 | |

TABLE 3

DOPANT-UNCOMPENSATED PRECURSORS

| # | Formula | Dopant Conc. (mole %) | $A_{X1}^{V1}$ | $A'_{X2}^{V2}$ | $D_{X3}^{V3}$ | $D'_{X4}^{V4}$ | $B_{X5}^{V5}$ |
|---|---|---|---|---|---|---|---|
| 10 | $Ba_{0.699}^{+2}Sr_{0.299}^{+2}Dy_{0.004}^{+3}Ti_{0.998}^{+4}O_3$ | 0.4 | $Ba_{0.699}^{+2}$ | $Sr_{0.299}^{+2}$ | $Dy_{0.004}^{+3}$ | 0 | $Ti_{0.998}^{+4}$ |
| 11 | $Ba_{0.697}^{+2}Sr_{0.299}^{+2}Dy_{0.010}^{+3}Ti_{0.995}^{+4}O_3$ | 1 | $Ba_{0.697}^{+2}$ | $Sr_{0.299}^{+2}$ | $Dy_{0.010}^{+3}$ | 0 | $Ti_{0.995}^{+4}$ |
| 12 | $Ba_{0.688}^{+2}Sr_{0.295}^{+2}Dy_{0.010}^{+3}Cr_{0.010}^{+3}Ti_{1.993}^{+4}O_3$ | 1 | $Ba_{0.688}^{+2}$ | $Sr_{0.295}^{+2}$ | $Dy_{0.010}^{+3}$ | $Cr_{0.010}^{+3}Ti_{0.010}^{+4}$ | $Ti_{0.983}^{+4}$ |

*D' includes a mixture of Cr and Ti in a combined amount exceeding the amount of the A-site dopant $Dy^{+3}$

EXAMPLE 5

Reagent Purity Control

An important factor in manufacturing dielectric materials having consistent characteristics from batch to batch is the use of high purity barium, strontium and titanium in making the precursor solutions. Usually, what is called "high purity" barium, strontium, and titanium in the trade has impurity levels of between 1 in $10^4$ and 1 in $10^5$ atoms of impurities for the more abundant elements. Impurity levels this high will be referred to herein as "R&D grade" materials. Precursor solutions made with such R&D grade materials do not provide sufficiently predictable results for materials used in the present invention. The methods of the present invention preferably require the use of material with higher purity than R&D grade, i.e. with impurities of less than 1 in $10^5$ TABLE 4-continued

SOLUTION CONTAMINANT COMPARISON

| IMPURITY | HIGH PURITY SOLUTION Impurity Level in PPM | R & D SOLUTION Impurity Level in PPM |
|---|---|---|
| Co | <0.1 | |
| Cr | <0.05 | |
| U | <0.002 | <5 |
| Th | <0.002 | <5 |

As indicated in Table 4, the "high purity" solution included no impurity element in a concentration greater than 4.3 parts per million, and the total of all impurities was only about 13 parts per million. The R&D grade solutions had impurity levels of 10 to 100 times higher. Preferably, for use in the present invention, the impurity level for most impurities will be 1 part per million or less.

EXAMPLE 6

Production of a Capacitor For use in a Dram Circuit

Figure 3:
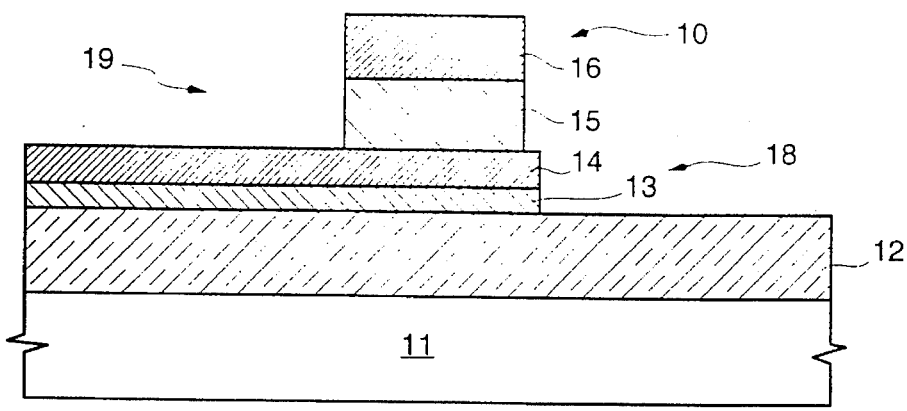
FIG. 3 depicts a silicon substrate bearing a thin-film capacitor of the present invention having a doped dielectric layer connecting first and second electrodes.

FIG. 3 depicts a thin film capacitor 10, which is fabricated according to the methods discussed below. As will be understood by those skilled in the art, the capacitor 10 is formed on a single crystal silicon wafer 11 having a thick layer 12 of silicon dioxide formed thereon. An adhesion layer 13 of titanium having a thickness of about 200 Å is then formed followed by a first electrode layer 14 of platinum having a thickness of about 2000 Å. Both layers 13 and 14 are preferably formed through the use of conventional sputtering protocols such as radio frequency ("r.f.") sputtering. A dielectric layer 15, which is preferably a metal oxide such as BST, is formed adjacent first electrode layer 14. BST dielectric layer 15 preferably includes A-site and B-site, as well as a dopant. A second platinum electrode 16 (also preferably about 2000 Å thick) is sputtered atop dielectric layer 15.

In the integrated circuit art, the silicon wafer 11 is often referred to as a "substrate." Herein, "substrate" may be used to refer to the silicon layer 11, but more generally will refer to any support for another layer. By way of example, the substrate 18 for the dielectric layer 15 is most immediately platinum first electrode 14, but also broadly includes layers 11, 12, and 13.

The crystalline metal oxide of layer 15 preferably has an $ABO_3$ perovskite structure. Many of these metal oxides are classified as ferroelectrics though some may not exhibit ferroelectricity at room temperature. Nevertheless, ferroelectrics of the invention typically have high dielectric constants, and are useful in high dielectric constant capacitors, whether or not they exhibit ferroelectric properties at normal operating temperatures.

Figure 4:
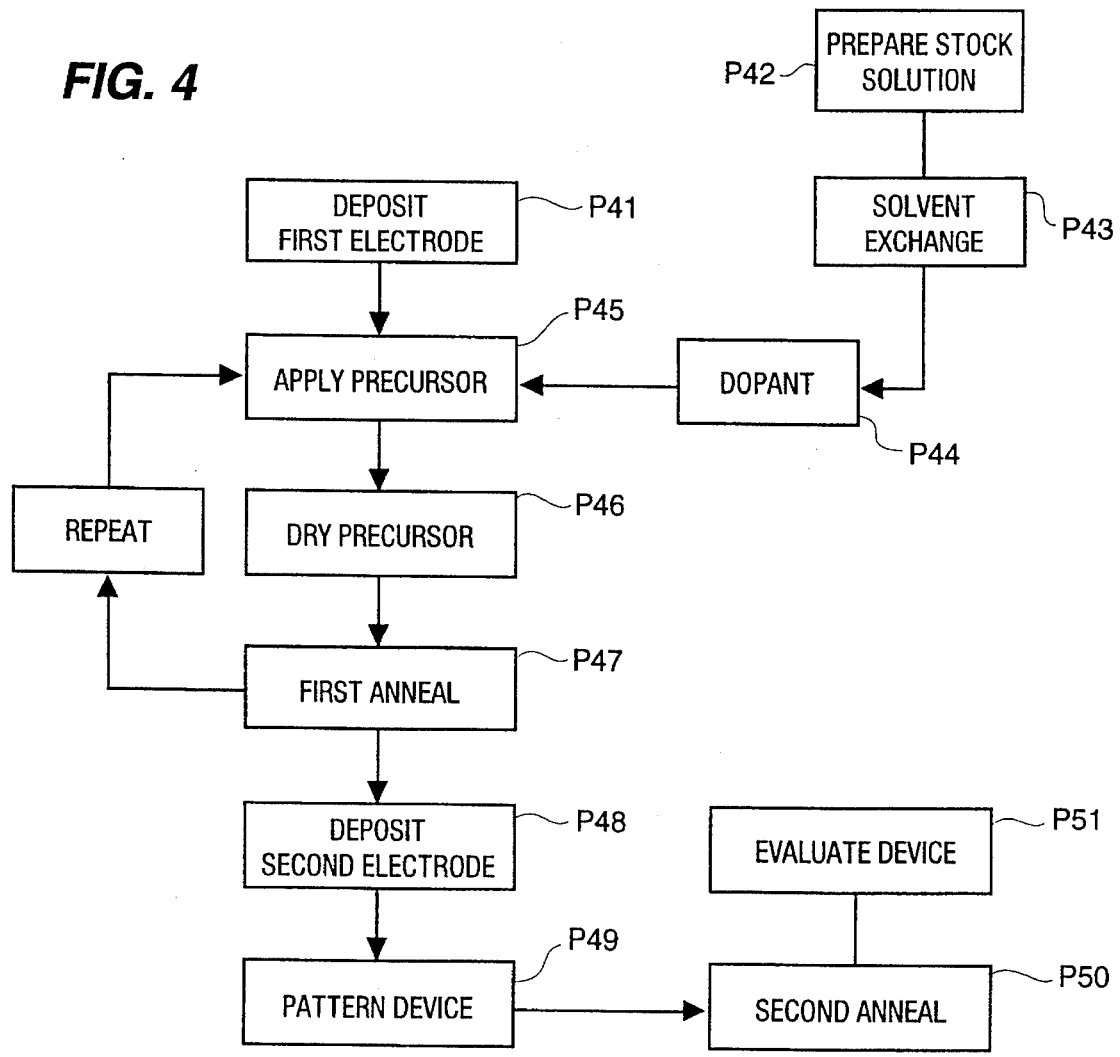
FIG. 4 is a process schematic diagram for the production of the capacitor depicted in FIG. 3.

FIG. 4 depicts a flow chart of a process for fabricating capacitor 10 of the present invention. The process shall be discussed in terms of the embodiment of FIG. 1, but those skilled in the art will understand its applicability to other embodiments. In step P41 a first electrode 14 was deposited onto substrate 13 by sputtering platinum, as is known in the art.

In step P42, a standard BST solution was prepared as in Example 1. Step P43 was a xylene exchange step as in Example 2. Step P44 included doping the precursor as in Example 3. The resultant 0.35M BST precursor solution was applied to the substrate in step P45.

In step P45, the precursor solution from step P44 was applied to the substrate 18. This was conducted by dropping the precursor solution onto substrate 18 and then spinning substrate 18 at about 1500 RPM (the preferred range is about 1500 RPM to 2000 RPM), for about 30 seconds.

In steps P46 and P47, the precursor was treated to form a metal oxide dielectric material 15 on substrate 18. This treating step was completed by drying and annealing the result of step P45. In step P46, the precursor was dried on a hot plate in a dry air atmosphere and at a temperature of about 400° C. (100° C. to 500° C. is a preferred drying temperature range) for a time of about two minutes (the preferred drying time ranges between about one minute to about thirty minutes, and most preferably from two to ten minutes). This high temperature drying step was essential in obtaining predictable properties in doped BST crystalline compositions.

In step P47, the dried precursor was annealed to form dielectric layer 15. This annealing step is referred to as the first anneal to distinguish it from a later annealing step. The first anneal was performed in oxygen at a temperature of about 750° C. (600° C. to 850° C. is preferred) for about 80 minutes in $O_2$. This time included the time used to create thermal ramps into and pout of the furnace, i.e., ten minutes for the "push" into the furnace and ten minutes for the "pull" out of the furnace. In a manufacturing process, it will be necessary to provide careful control of the annealing temperatures and times, in order to provide consistent and reproducible results.

Steps P45, P46, and P47 were conducted a second time to achieve a thickness of about 1800 Å in dielectric layer 15.

In step P48 a second electrode 16 was deposited by sputtering. The device was then patterned by a conventional photoetching process including the application of a photoresist followed by ion etching, as will be understood by those skilled in the art. This patterning occurred before the second annealing step P50 so that patterning stresses were removed by the annealing step, and any oxide defects created by the patterning were corrected.

The second annealing step, P50, was performed in like manner with the first anneal in step P47, taking care not to vary the annealing temperature by an amount greater than a small temperature range of from about 50° C. to 100° C. with respect to the first (750° C.) annealing temperature. The time for the second anneal was about 30 minutes in duration (twenty to ninety minutes is preferred).

Finally, in step P51 the device was completed and evaluated as a doped BST control sample. This process was repeated for almost all of the doped precursor solutions of Tables 2 and 3 including samples 1 through 6 and 9 through 12. These respective solutions produced representative capacitors incorporating the corresponding solid dielectric materials. Additionally, the process was twice repeated without doping step P44 to produce two BST non-doped control samples having BST materials of the formula $(Ba_{0.7}Sr_{0.3}Ti_{1.0}O_3)$.

EXAMPLE 7

Evaluation of Capacitor Materials

Each of the capacitors that were produced in Examples 6 and 7 were subjected to tests for purposes of determining the respective dielectric constants and the leakage current capacities of the capacitors.

Dielectric constants for each of the capacitors were determined according to conventional protocols utilizing a Hewlet Packard 4285A LCR meter at a temperature of 295° K. using an area of 7850 μm² over a frequency range from 80 to 1000 kHz. Leakage currents were determined according to conventional protocols using a Hewlet Packard 4140B picoampmeter. Measurements were conducted at a temperature of about 293° K. for layers of about 1800 Å thickness by stepping a bias voltage at one second intervals over a voltage domain ranging from 0.2 to 5 V.

Figure 5:
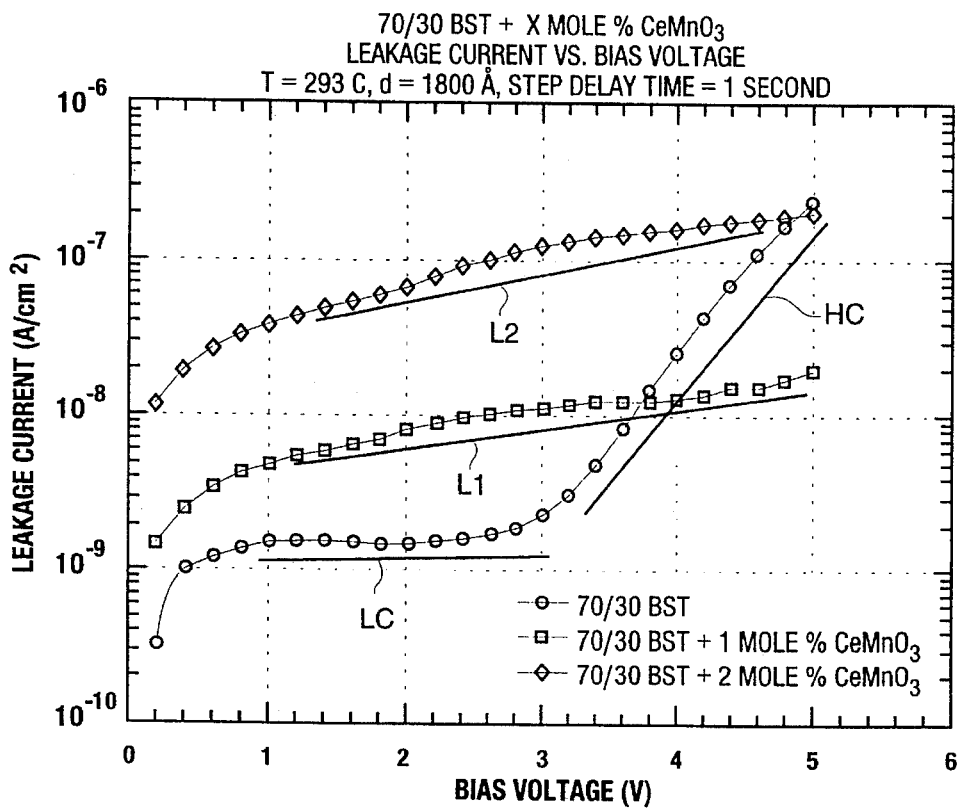
FIG. 5 depicts a comparative plot of data obtained from a set of $CeMnO_3$-doped BST compositions versus data obtained from a control sample of non-doped BST, wherein a logarithmic ordinate represents leakage current and the abscissa represents bias voltage.

FIG. 5 is a plot of the leakage current results obtained for the CeMn doped capacitors, i.e., sample 3 ($Ba_{0.693}^{+2}Sr_{0.2978}^{+2}Ce_{0.010}^{+3}Mn_{0.010}^{+3}Ti_{0.990}^{+4}O_3$; stock BST doped with 1 mole % $CeMnO_3$) and sample 4 ($Ba_{0.686}^{+2}Sr_{0.294}^{+2}Ce_{0.020}^{+3}Mn_{0.020}^{+3}Ti_{0.980}^{+4}O_3$; stock BST doped with 2 mole % $CeMnO_3$), wherein the abscissa represents bias voltage values, and the ordinate represents a logarithm of leakage current in A/cm². The control sample exhibited a relatively low leakage current over a substantially linear portion "LC" ranging from about 0.8 to about 3 V, followed by a steeper rate of leakage current increase following line HC from 3 V to 5 V. It is believed that the LC portion results from a dominant electron transfer by a "field emission" mechanism, while the HC portion results from a "Schottky emission" mechanism which, for this sample, predominates at a bias above 3 V, as will be understood by those skilled in the art. In contrast, the 1% CeMn sample exhibits only a linear "L1" portion corresponding to a field emission band, and the 2% sample exhibits a linear portion "L2" corresponding to a field emission band. Portions L1 and L2 range between about 1 and 5 V, with the hypothesized Schottky emission band for these samples (which would correspond to HC) being shifted to voltages in excess of 5 V. As is apparent, the result of up-shifting the Schottky emission voltage is that the 1% and 2% lines eventually intersect the control line to provide lower leakage currents than does the control at higher voltages. For example, the 70/30 BST plus 1 mole % $CeMnO_3$ sample improved leakage current results by more than a factor of ten at 5 V.

In the interpretation of these results, it should be understood that those skilled in the art may disagree whether the increasingly steep portion HC is caused by a change in a certain predominant type of electron emission mechanism, and especially whether the changeover is one occurring from a field emission to a Schottky emission. Herein, the term "emission-type changeover" is hereby defined to mean a substantial change, i.e., greater than about 20%, in the slope of a generally straight portion of a line plotted as current density versus bias voltage.

Figure 6:
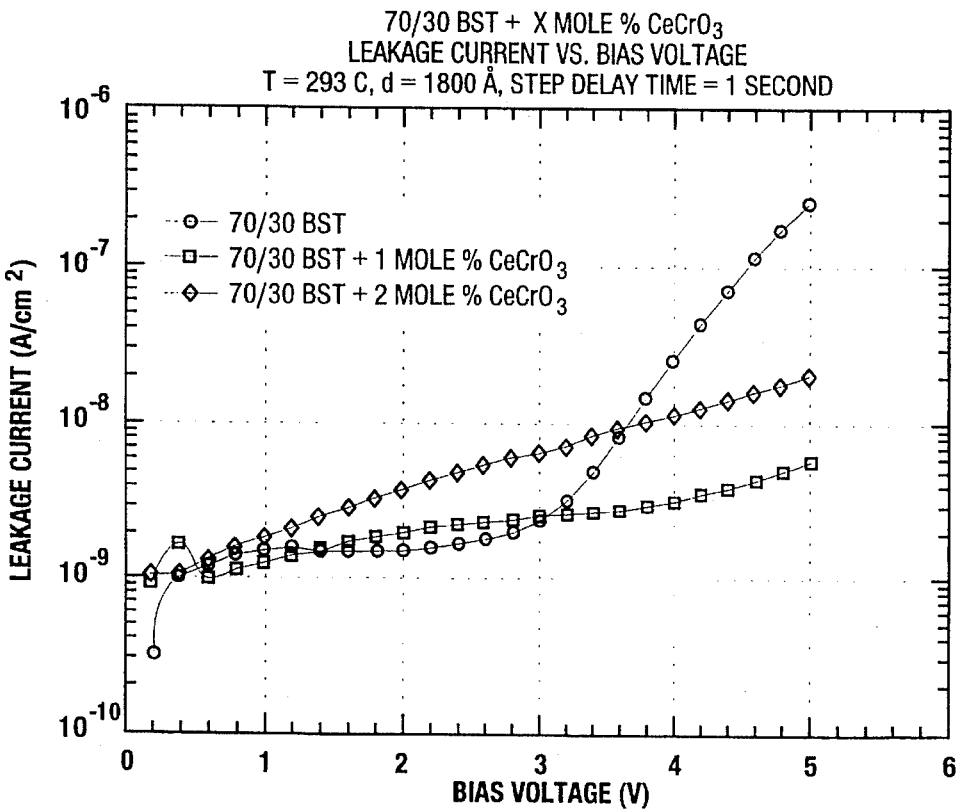
FIG. 6 depicts a comparative plot like that of FIG. 5, but represents data obtained from a set of $CeCrO_3$-doped BST samples.

FIG. 6 is a plot like that of FIG. 5 but depicting results for the CeCr doped samples, i.e., sample 1 ($Ba_{0.693}^{+2}Sr_{0.297}^{+2}Ce_{0.010}^{+3}Cr_{0.010}^{+3}Ti_{0.990}^{+4}O_3$; stock BST doped with 1 mole % $CeCrO_3$) and sample 2 ($Ba_{0.686}^{+2}Sr_{0.294}^{+2}Ce_{0.020}^{+3}Cr_{0.020}^{+3}Ti_{0.980}^{+4}O_3$; stock BST doped with 2 mole % $CeCrO_3$). The CeCr compositions are particularly preferred because of their low leakage current properties. The CeCr compositions approximate the control sample leakage current values over the 0.2 to 3 V low voltage domain, exhibit improved leakage current values at voltages in excess of about 3 V, and shift the Schottky emission band to values exceeding 5 V.

Figure 7:
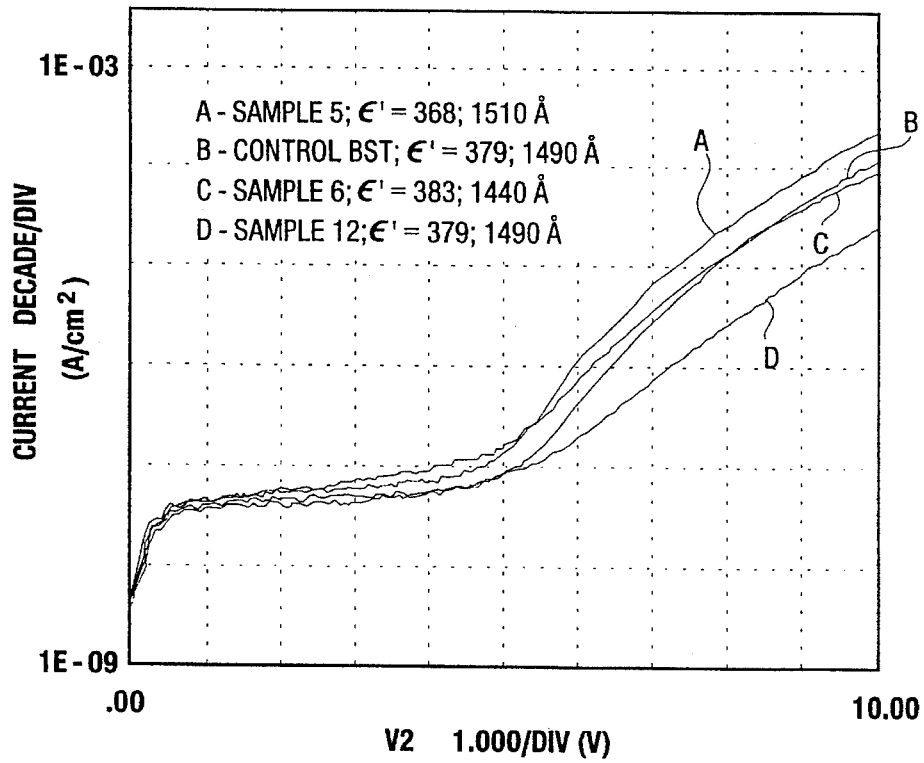
FIG. 7 depicts a comparative plot like that of FIG. 5, but represents data obtained from dysprosium and chromium-doped BST samples.

FIG. 7 is a plot like that of FIG. 5, but depicting results obtained for sample 5 ($Ba_{0.697}^{+2}Sr_{0.299}^{+2}Dy_{0.004}^{+3}Cr_{0.004}^{+3}Ti_{0.996}^{+4}O_3$; stock BST doped with 4 mole % $DyCrO_3$), sample 6 ($Ba_{0.693}^{+2}Sr_{0.297}^{+2}Dy_{0.010}^{+3}Cr_{0.010}^{+3}Ti_{0.990}^{+4}O_3$; stock BST doped with 1 mole % $DyCrO_3$), and sample 12 ($Ba_{0.688}^{+2}Sr_{0.295}^{+2}Dy_{0.010}^{+3}Cr_{0.010}^{+3}Ti_{1.993}^{+}O_3$; stock BST doped with 1 mole % $DyCrTiO_5$. A significant electron emission-type changeover appears in all of the samples. These samples are compared to a control sample made from a stock BST sample. Sample 12 provides significant improvement to leakage current values for voltages exceeding about 5 V. Samples 5 and 6 are exhibit approximately the same behavior as the control BST solution.

Figure 8:
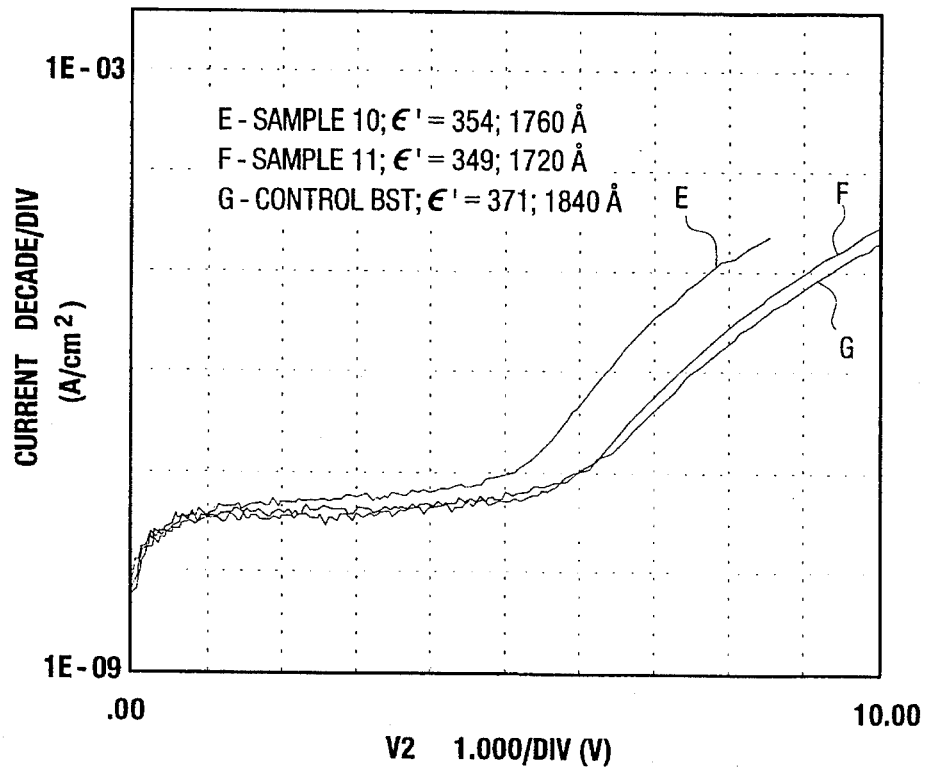
FIG. 8 depicts a comparative plot like that of FIG. 5, but represents data obtained from dysprosium-doped BST samples.

FIG. 8 is a plot like that of FIG. 5, but depicting results obtained for samples 10 ($Ba_{0.698}^{+2}Sr_{0.299}^{+2}Dy_{0.004}^{+3}Ti_{0.999}^{+4}O_3$; stock BST doped with 0.4 mole % Dy) and 11 ($Ba_{0.695}^{+2}Sr_{0.298}^{+2}Dy_{0.010}^{+3}Ti_{0.996}^{+4}O_3$; stock BST doped with 1 mole % Dy). These doped samples exhibited lower leakage current values and lower dielectric constants than did the stock BST material.

Figure 9:
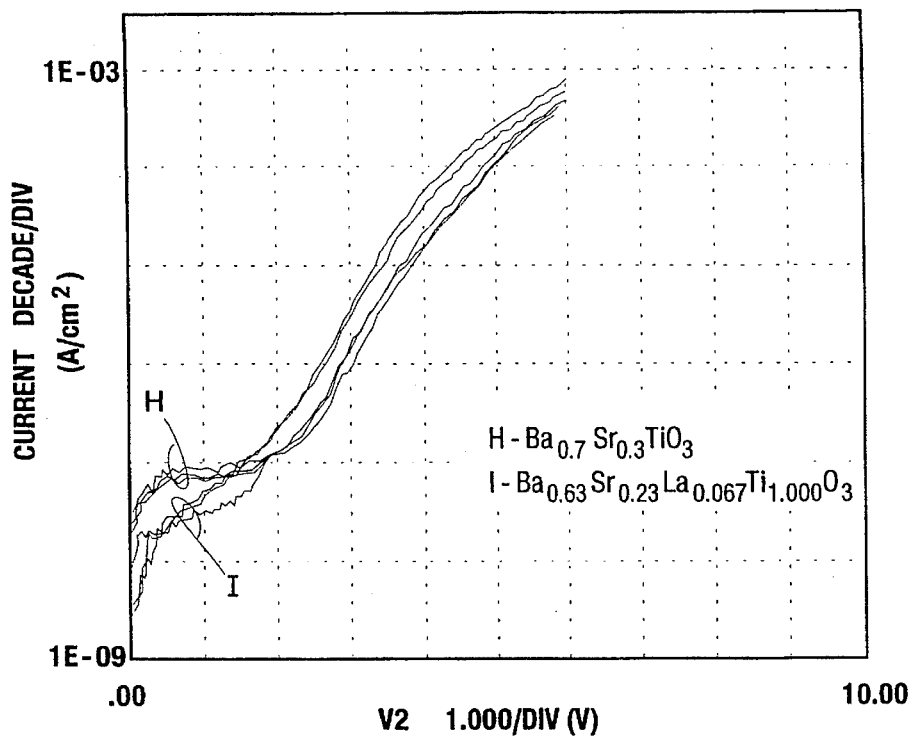
FIG. 9 depicts a comparative plot like that of FIG. 5, but represents data obtained from a lanthanum and titanium-doped BST sample.

FIG. 9 is a plot like that of FIG. 5, but depicting results obtained for sample 9 ($Ba_{0.630}^{+2}Sr_{0.270}^{+2}La_{0.067}^{+3}Ti_{1.000}^{+4}O_3$; stock BST doped with 10 mole % $La_{0.67}Ti_{1.0}O_3$). Sample 9 exhibits improved leakage current performance in the lower voltage region between about 0 and 1.5 V.

Figure 10:
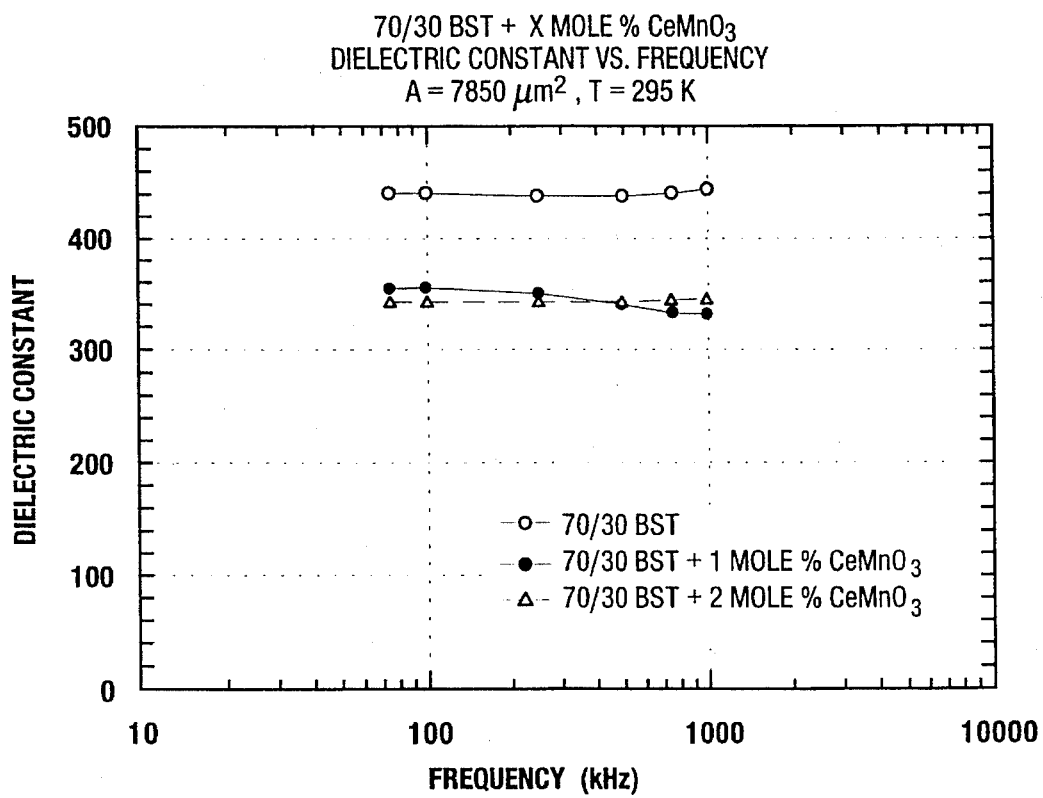
FIG. 10 depicts a comparative plot data obtained for cerium and magnesium-doped sampled and data obtained from a control sample of non-doped BST, wherein the ordinate represents a dielectric constant, and the abscissa represents current frequency.

FIG. 10 is a plot of the dielectric constant results obtained from the 1% and 2% $CeMnO_3$ doped samples (samples 3 and 4), wherein the abscissa represents values for an alternating voltage frequency in kHz, and the ordinate represents values for empirically determined dielectric constants. The CeMn doped samples had a dielectric constant reduced by about 20%–25% as compared to the control sample; however, the overall dielectric constant of about 340 was still quite high.

Figure 11:
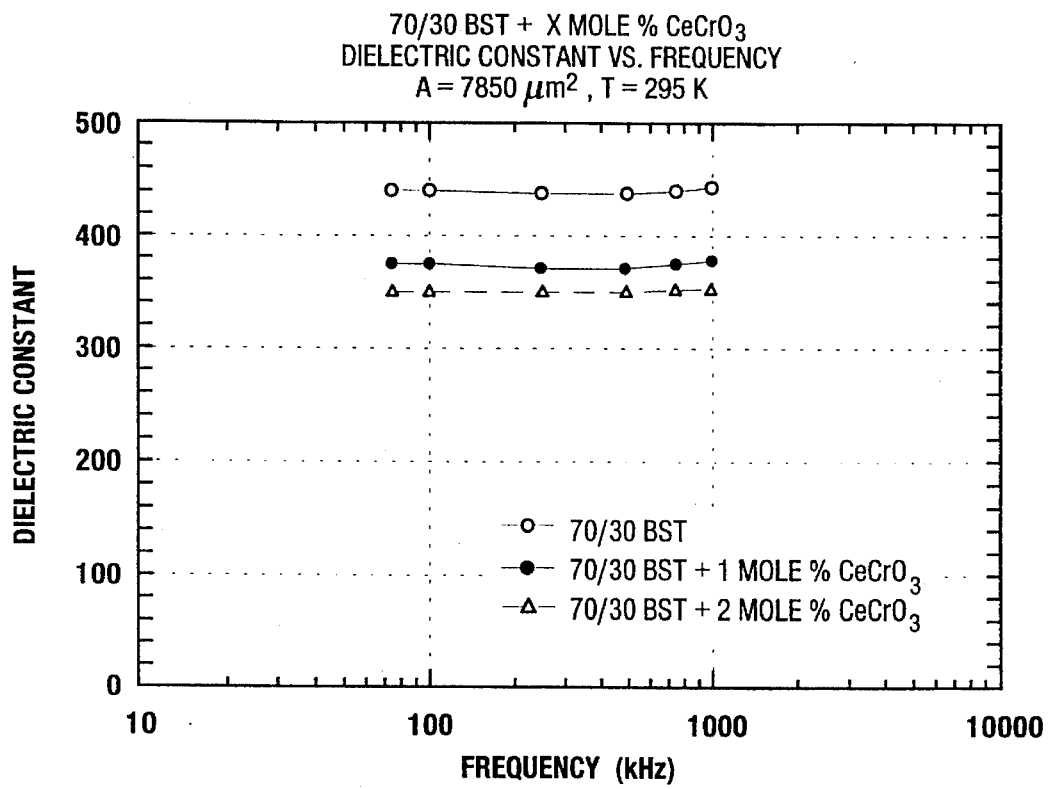
FIG. 11 depicts a plot like that of FIG. 10, but represents data obtained for cerium and chromium-doped samples.

FIG. 11 is a plot like FIG. 10, but depicting dielectric constant results for the 1% and 2% $CeCrO_3$ doped samples of Table 2 (samples 1 and 2). Over the frequency range studied, the dielectric constant of the doped samples was reduced by about 15% (for 1% CeCr) to 20% (for 2% CeCr) with respect to the control sample; however, the overall dielectric constants of about 350–370 were still quite high.

Figure 12:
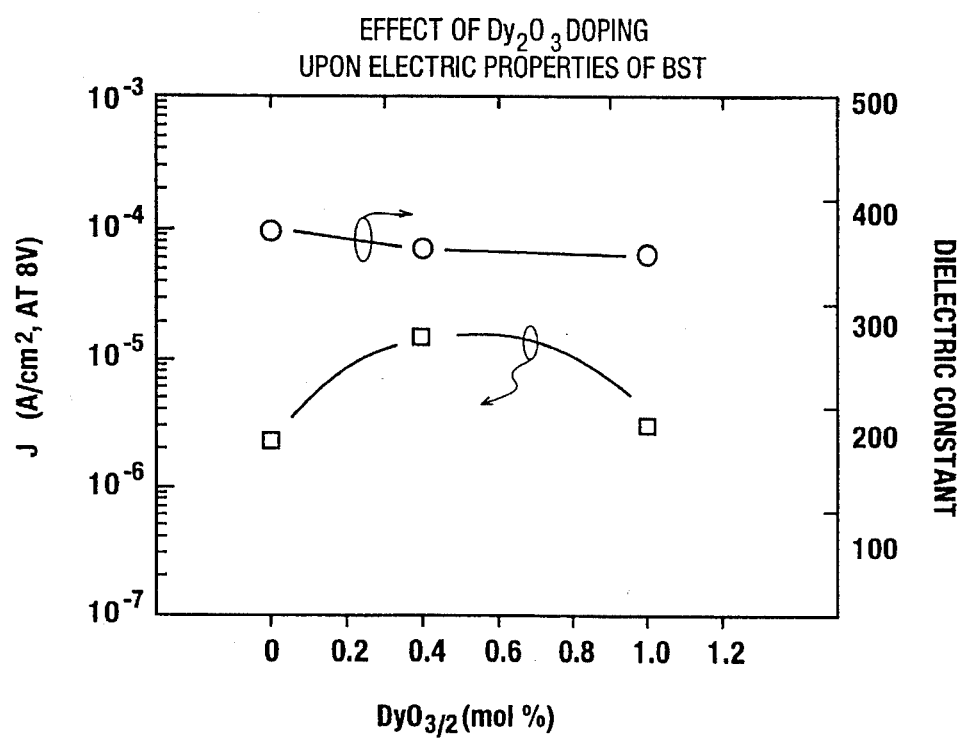
FIG. 12 depicts a plot of data obtained from dysprosium doped samples, wherein the left-hand side ordinate represents leakage current density (at 8 V bias), the right-hand side ordinate represents dielectric constant values, and the abscissa represents the molar percentage of dysprosium in one mole of the crystalline solid.

FIG. 12 depicts a sensitivity analysis of the effect of $DyO_{3/2}$ content in BST upon current density and dielectric constant. The left hand ordinate represents a logarithmic scale of current density determined at 8 V, the right hand ordinate represents the dielectric constant, and the abscissa represents a dysprosium oxide dopant concentration for samples 10 and 11. The leakage current follows a parabolic track that is typical of bulk ceramics, and the dielectric constant drops very slightly with increasing dopant concentration. These results are typical of bulk ceramic materials, but have heretofore not been observed in BST-based thin-films.

Figure 13:
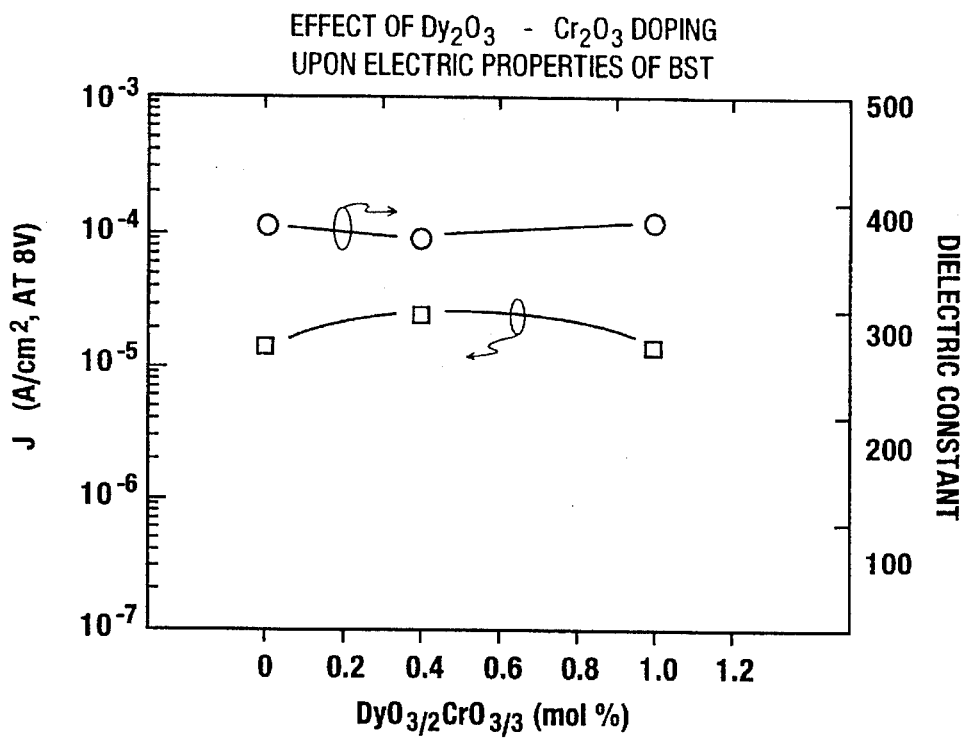
FIG. 13 depicts a plot like that of FIG. 13, but represents samples doped with dysprosium and chromium moieties.

FIG. 13 is a plot like that of FIG. 12, but depicting results for the dysprosium and chromium oxide doped thin-film BST materials of samples 5 and 6. Again, this thin film material exhibits a parabolic track that was previously observed only in bulk ceramics, with the dielectric constant holding essentially constant or even increasing with the dopant concentration.

Figure 14:
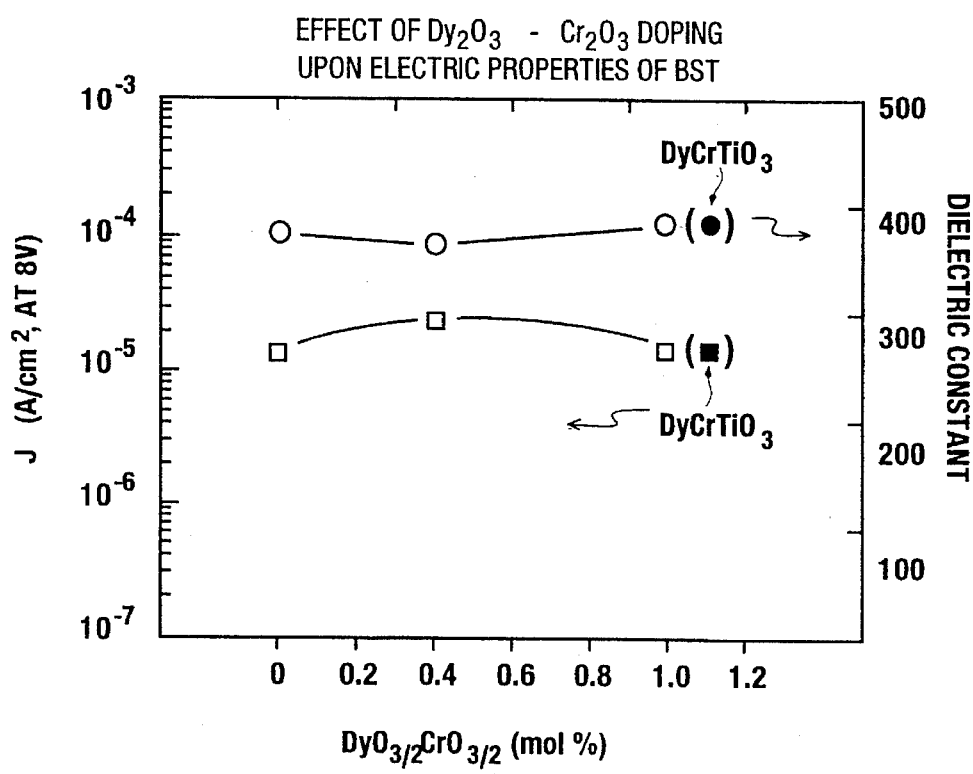
FIG. 14 depicts a plot identical to that of FIG. 13, but having additional data for a sample doped with dysprosium, chromium, and titanium.

FIG. 14 duplicates FIG. 13 with respect to the data for samples 5 and 6, and further includes data for BST doped with 1 mole % of dysprosium chromium titanate (sample 12). It is apparent that the addition of excess B-site materials (i.e., sample 12; titanium and chromium) significantly lowers the current density while permitting the dielectric constant to remain essentially unchanged with respect to BST that is doped with the dysprosium and chromium oxides of samples 5 and 6.

Table 5 below serves to summarize the results of these measurements, and also presents the dielectric dissipation factor as "tan d," wherein d is the dielectric loss angle. As indicated on previous figures, the manufacturing process produced dielectric layers having slight variances in thickness for the respective samples. Variance in the thickness of the dielectric layer is responsible for many of the differences that are observed in Table 5; however, the dopants are also responsible for important differences. By way of example, sample 12 has a thickness of 1490 Å and a dielectric constant of 379, as does one of the control samples. Even so, sample 12 exhibits almost an order of magnitude reduction in leakage current. The dielectric constants were measured at about 1000 kHz, and the dissipation factors were measured at 31 mHz and 50 mV. The two stock BST samples exhibit differences in electronic performance that are primarily functions of layer thickness.

TABLE 5

SUMMARY OF ELECTRONIC PERFORMANCE RESULTS

| # | DOPANT (MOLE %) | | | Thickness | Dielectric Constant | tan d* | J@8V |
| | $Dy_2O_3$ | $Cr_2O_3$ | $TiO_2$ | Å | $@V_{bias} = 0$ | | $(A/cm^2)$ |
|---|---|---|---|---|---|---|---|
| 1 | 1.0 | 1.0 | — | 1440 | 383 | 1.46 | 1.3E-5 |
| 5 | 0.4 | 0.4 | — | 1510 | 368 | 1.43 | 2.2E-5 |
| 10 | 0.4 | — | — | 1760 | 354 | 1.28 | 1.4E-5 |
| 11 | 1.0 | — | — | 1720 | 349 | 1.38 | 3.0E-6 |
| 12 | 1.0 | 1.0 | 1.0 | 1490 | 379 | 1.45 | 2.0E-6 |
| Stock BST | — | — | — | 1840 | 371 | 1.35 | 2.2E-6 |
| Stock BST | — | — | — | 1490 | 379 | 1.42 | 1.3E-5 |

EXAMPLE 8

Identification of A and B-Site Dopants

The primary factor that influences the A or B-site positioning of elements within an $ABO_3$ crystalline matrix is the ionic radius. In general terms, A-site cations have radii that are greater than the radii of B-site cations; however, this is a relative measurement. Using the A-site cations for BST as an example, $Ba^{+2}$ has a radius (in crystal) of about 1.34 Å, and $Sr^{+2}$ has a radius of about 1.12 Å. The B-site cation $Ti^{+4}$ has an atomic radius of about 0.68. Accordingly, it is preferred that the dopant and dopant compensator have radii within 20% of the corresponding A or B-site cations from the $ABO_3$ structure, in order to avoid redefinition of the crystalline matrix at higher dopant concentrations exceeding about 1 to 5 mole %.

Those skilled in the art will understand that the preferred embodiments, as hereinabove described, may be subjected to obvious modifications without departing from the true scope and spirit of the invention. Accordingly, the inventors hereby state their intention to rely upon the Doctrine of Equivalents, in order to protect their full rights in the invention.

I claim:

1. A method of preparing a precursor liquid for use in fabricating $ABO_3$ perovskite dielectric thin film integrated circuit components, comprising the steps of:

furnishing an A-site portion including a first liquid polyoxyalkylated metal complex having at least one A-site metal moiety bonded to first organic ligands selected from a first group consisting of alkoxides, carboxylates, and alkoxycarboxylates;

combining said A-site portion with a B-site portion including a second liquid polyoxyalkylated metal complex having at least one B-site metal moiety bonded to second organic ligands selected from a second group consisting of alkoxides and alkoxycarboxylates when said first organic ligands are carboxylates, alkoxycarboxylates and carboxylates when said first organic ligands are alkoxides, and alkoxides and carboxylates, when said first organic ligands are alkoxycarboxylates, said A-site portion and said B-site portion forming a mixture;

heating said mixture to eliminate water and react said A-site portion with said B-Site portion with yield of a bimetallic portion including molecules having both an A-Site metal and a B-site metal;

providing a dopant portion including a third liquid polyoxyalkylated metal complex having at least one dopant moiety selected from a group consisting of A-site metals and B-site metals; and mixing said A-site portion, said B-site portion, and said dopant portion to substantial homogeneity throughout said liquid to make said liquid ready for application to an integrated circuit substrate, said liquid being essentially water-free in a made-ready state.

2. The method as set forth in claim 1, further including the step of adding a liquid dopant compensator portion including a fourth liquid polyoxyalkylated metal complex having a B-site metal when said dopant moiety is an A-site metal, and an A-site metal when said dopant moiety is a B-site metal.

3. The method as set forth in claim 1, wherein said mixing step includes said A-site portion, said B-site portion, and said dopant portion mixed in respective molar proportions sufficient to provide a combination of said A-site metal, said B-site metal and said dopant capable of balancing a ternary oxygen charge in an $ABO_3$ perovskite crystalline structure to be formed; from said liquid.

4. The method as set forth in claim 3, wherein said mixing step includes mixing respective molar portions equaling X1, X2, X3, X4, and X5 for said perovskite crystalline structure having an average formula

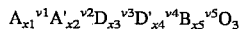

wherein A and A' and are A-site metals from said A-site portion including cations independently selected from an A-site metal group consisting of Ba, Bi, Sr, Pb, La, Ca, and mixtures thereof;

B is a B-site metal including a B-site cation selected from a B-site metal group consisting of Ti, Zr, Ta, Mo, W, Nb, and mixtures thereof;

D is a dopant selected from a dopant group consisting of all A and B-site metal cations and mixtures thereof;

D' is a dopant compensator including a B-site metal cation when D is an A-site metal cation, and an A-site metal cation when D is a B-site metal cation;

X1, X2, X3, X4 and X5 are respective stoichiometric proportions of elements in the formula, with X1, X3, and X5 each being greater than zero, and X2 and X4 being any proportion including zero;

V1, V2, V3, V4, and V5 are whole numbers equal to respective outer electron shell valences corresponding to the elements of the formula; and $O_3$ is a ternary oxygen moiety, with the formula substantially obeying an oxygen moiety charge balance relationship $$X1*V1+X2*V2+X3*V3+X4*V4+X5*V5=6\pm.06.$$

5. The method as set forth in claim 4, wherein said formula substantially obeys the charge balancing relationship $$X3*V3=X4*V4.$$

6. The method as set forth in claim 1, wherein said third liquid polyoxyalkylated metal complex is selected from an organic group consisting of metal alkoxides, metal carboxylates, metal alkoxycarboxylates, and mixtures thereof.

7. The method as set forth in claim 1, wherein each of said first liquid polyoxyalkylated metal complex, said second liquid polyoxyalkylated metal complex, and said third liquid polyoxyalkylated metal complex are independently selected from an organic group consisting of a metal isopropoxide, a metal 2-ethylhexanoate, a metal neodecanoate, a metal octanoate, and mixtures thereof.

8. The method as set forth in claim 7, wherein each of said first liquid polyoxyalkylated metal complex, said second liquid polyoxyalkylated metal complex, and said third liquid polyoxyalkylated metal complex includes an alkoxycarboxylate moiety.

9. The method as set forth in claim 1, wherein said furnishing step includes said A-site metal moiety selected from an A-site metal group consisting of Ba, Bi, Sr, Pb, La, Ca, and mixtures thereof.

10. The method as set forth in claim 9, wherein said A-site portion includes a mixture of Ba and Sr moieties.

11. The method as set forth in claim 9, wherein said supplying step includes said B-site moiety selected from a B-site group consisting of Ti, Zr, Ta, Mo, W, Nb, and mixtures thereof.

12. The method as set forth in claim 11, wherein said B-site moiety is Ti.

13. The method as set forth in claim 11, wherein said third liquid polyoxyalkylated metal complex includes a moiety selected from a dopant group consisting of all metals and mixtures thereof.

14. The method as set forth in claim 13, wherein said dopant group is consisting of dysprosium, manganese, chromium, cerium, and mixtures thereof.

15. A liquid precursor solution produced by the method of claim 13.

16. The method as set forth in claim 14, wherein said dopant is cerium.

17. The method as set forth in claim 1, wherein said supplying step includes reacting a B-site element with a first oxyorganic ligand to form said second liquid polyoxyalkylated metal complex in a liquid solution with said first liquid polyoxyalkylated metal complex.

18. The method as set forth in claim 17, wherein said providing step includes reacting a dopant metal with a second oxyorganic ligand to form said dopant portion separately from said solution.

19. The method as set forth in claim 1, wherein said mixing step includes combining said A-site portion and said B-site portion prior to providing said dopant portion.

20. The method as set forth in claim 1, including a step of adding a solvent prior to said mixing step.

21. The method as set forth in claim 20, wherein said solvent is selected from a solvent group consisting of 2-methoxyethanol, xylene, and N-butyl acetate.

22. The method as set forth in claim 1, wherein said mixing step includes stirring under a desiccated inert atmosphere.

23. A liquid precursor solution produced by the method of claim 1.

24. A liquid precursor solution produced by the method of claim 2.

* * * * *